(12) United States Patent
Liaw

(10) Patent No.: US 11,043,490 B2
(45) Date of Patent: Jun. 22, 2021

(54) SEMICONDUCTOR DEVICE HAVING A DIELECTRIC DUMMY GATE

(71) Applicant: TAIWAN SEMICONDUCTOR MANUFACTURING CO., LTD., Hsinchu (TW)

(72) Inventor: Jhon-Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/726,005

(22) Filed: Dec. 23, 2019

(65) Prior Publication Data
US 2020/0135728 A1 Apr. 30, 2020

Related U.S. Application Data

(63) Continuation of application No. 15/924,262, filed on Mar. 18, 2018, now Pat. No. 10,515,954.

(51) Int. Cl.
| | |
|---|---|
| H01L 27/08 | (2006.01) |
| H01L 27/02 | (2006.01) |
| H01L 29/06 | (2006.01) |
| H01L 27/088 | (2006.01) |
| H01L 29/66 | (2006.01) |
| H01L 21/8234 | (2006.01) |
| H01L 29/78 | (2006.01) |
| H01L 27/108 | (2006.01) |

(Continued)

(52) U.S. Cl.
CPC .. *H01L 27/0886* (2013.01); *H01L 21/823431* (2013.01); *H01L 27/0207* (2013.01); *H01L 29/0692* (2013.01); *H01L 29/66545* (2013.01); *H01L 27/0924* (2013.01); *H01L 27/10826* (2013.01); *H01L 27/10879* (2013.01); *H01L 27/1211* (2013.01); *H01L 29/7856* (2013.01)

(58) Field of Classification Search
CPC ............ H01L 27/0886; H01L 27/0207; H01L 29/0692; H01L 29/66545; H01L 29/6606; H01L 29/66871
See application file for complete search history.

(56) References Cited

U.S. PATENT DOCUMENTS

| | | |
|---|---|---|
| 7,180,134 B2 | 2/2007 | Hu |
| 7,655,989 B2 | 2/2010 | Tan |

(Continued)

*Primary Examiner* — Ida M Soward
(74) *Attorney, Agent, or Firm* — Maschoff Brennan

(57) ABSTRACT

A semiconductor device includes a dielectric dummy gate, a plurality of first semiconductor fins, and a plurality of second semiconductor fins. The dielectric dummy gate extends along a first direction. The first semiconductor fins extend along a second direction within a first core circuit region on a first side of the dielectric dummy gate, and the second direction is substantially perpendicular to the first direction. The second semiconductor fins extend along the second direction within a second core circuit region on a second side of the dielectric dummy gate opposite the first side of the dielectric dummy gate. A number of the second semiconductor fins within the second core circuit region is less than a number of the first semiconductor fins within the first core circuit region, and each of the second semiconductor fins has a width less than a width of each of the first semiconductor fins.

20 Claims, 15 Drawing Sheets

(51) Int. Cl.
*H01L 27/12* (2006.01)
*H01L 27/092* (2006.01)

(56) References Cited

U.S. PATENT DOCUMENTS

| | | | | |
|---|---|---|---|---|
| 8,809,963 | B2* | 8/2014 | Liaw | H01L 27/0207 |
| | | | | 257/390 |
| 8,987,836 | B2* | 3/2015 | Kim | H01L 29/785 |
| | | | | 257/401 |
| 9,029,217 | B1 | 5/2015 | Brunco | |
| 9,184,053 | B2 | 11/2015 | Iwamatsu | |
| 9,196,548 | B2* | 11/2015 | Rashed | H01L 27/1211 |
| 9,373,386 | B2* | 6/2016 | Liaw | G11C 8/16 |
| 9,437,713 | B2 | 9/2016 | Gendron | |
| 9,553,032 | B2 | 1/2017 | Basker | |
| 9,570,454 | B2 | 2/2017 | Chang | |
| 9,576,980 | B1 | 2/2017 | Basker | |
| 9,595,475 | B2 | 3/2017 | Liaw | |
| 9,613,953 | B2* | 4/2017 | Liaw | H01L 27/088 |
| 9,780,097 | B2* | 10/2017 | Lee | H01L 27/0924 |
| 9,805,985 | B2* | 10/2017 | Liaw | H01L 27/088 |
| 9,824,747 | B2* | 11/2017 | Liaw | H01L 27/1104 |
| 9,859,392 | B2 | 1/2018 | Kim | |
| 10,002,925 | B2 | 6/2018 | Cheng | |
| 10,032,877 | B2 | 7/2018 | Chang | |
| 10,043,814 | B2 | 8/2018 | Yamashita | |
| 10,109,531 | B1 | 10/2018 | Cheng | |
| 10,163,904 | B1* | 12/2018 | Liaw | H01L 29/7846 |
| 10,269,644 | B2 | 4/2019 | Basker | |
| 10,515,967 | B2* | 12/2019 | Liaw | H01L 21/823892 |
| 10,522,528 | B2* | 12/2019 | Liaw | H01L 27/0928 |
| 10,566,329 | B2* | 2/2020 | Yabuuchi | G11C 7/1084 |
| 10,622,256 | B2* | 4/2020 | Mun | H01L 21/823431 |
| 10,879,245 | B2* | 12/2020 | Liaw | H01L 29/66795 |
| 2013/0224936 | A1* | 8/2013 | Lee | H01L 21/823431 |
| | | | | 438/492 |
| 2015/0069526 | A1 | 3/2015 | Basker | |
| 2015/0069562 | A1 | 3/2015 | Sandhu | |
| 2015/0228722 | A1 | 8/2015 | Baek | |
| 2015/0243667 | A1* | 8/2015 | Liaw | H01L 29/6681 |
| | | | | 257/390 |
| 2016/0020109 | A1 | 1/2016 | Yoo | |
| 2016/0064075 | A1* | 3/2016 | Miyakawa | G11C 11/1653 |
| | | | | 365/51 |
| 2016/0379982 | A1 | 12/2016 | Park | |
| 2017/0040319 | A1 | 2/2017 | Leobandung | |
| 2017/0069630 | A1 | 3/2017 | Cha | |
| 2017/0110325 | A1* | 4/2017 | Yoo | H01L 21/823456 |
| 2017/0179123 | A1 | 6/2017 | Chang | |
| 2017/0236821 | A1 | 8/2017 | Kim | |
| 2017/0358592 | A1* | 12/2017 | Yamaguchi | H01L 21/67167 |
| 2017/0372971 | A1 | 12/2017 | Choi | |
| 2018/0181679 | A1* | 6/2018 | Hong | G06F 16/90339 |
| 2019/0067112 | A1 | 2/2019 | Chang | |
| 2019/0131309 | A1* | 5/2019 | Liaw | H01L 27/0924 |

* cited by examiner

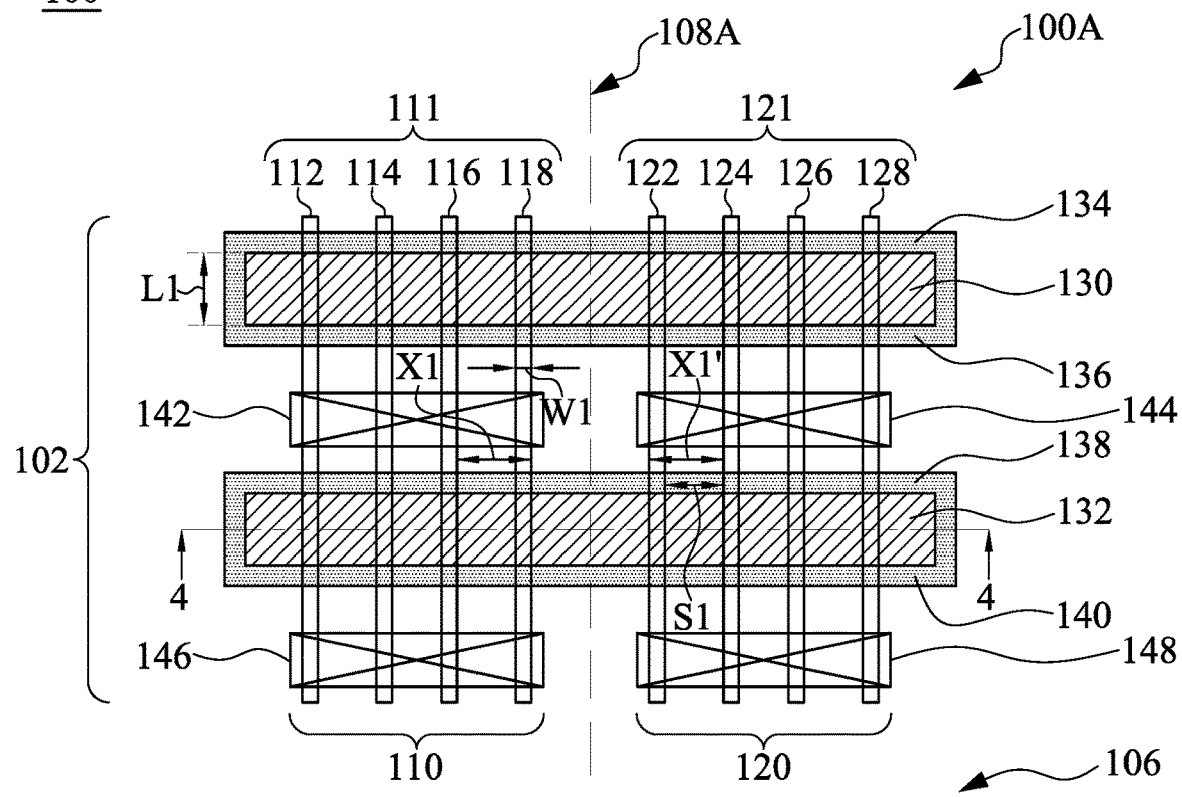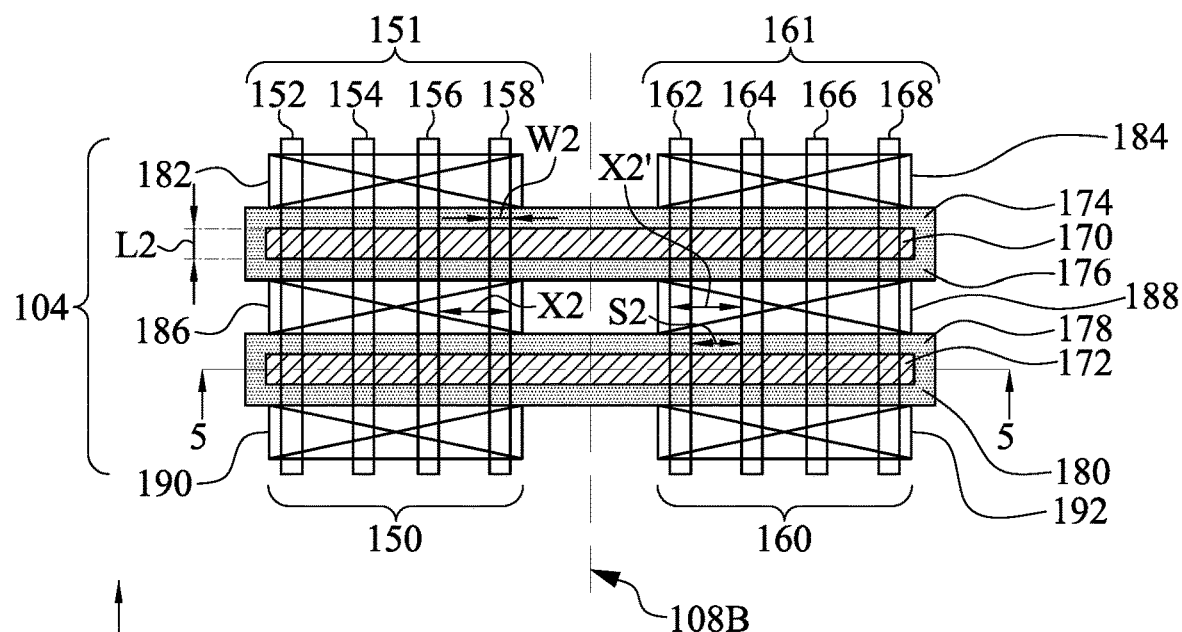
Fig. 3

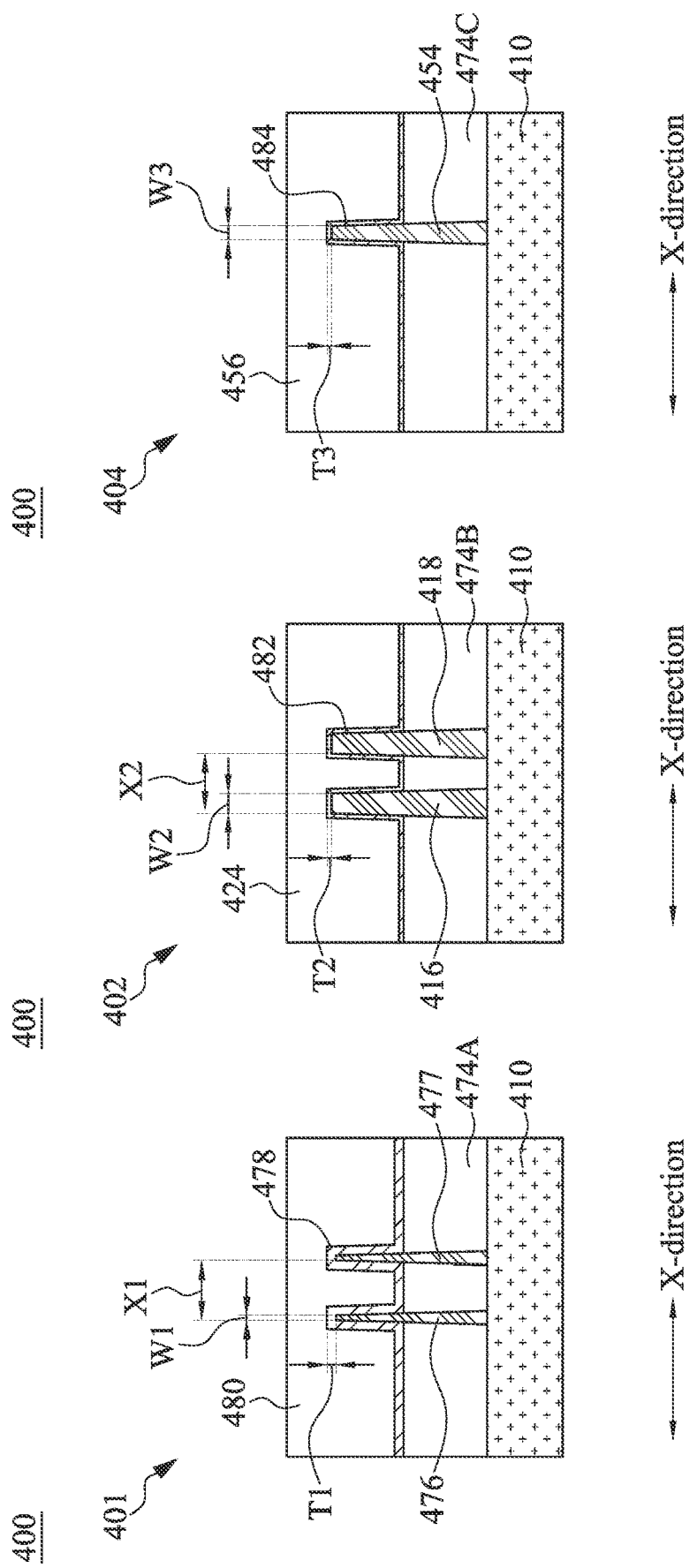

SEMICONDUCTOR DEVICE HAVING A DIELECTRIC DUMMY GATE

PRIORITY CLAIM AND CROSS-REFERENCE

The present application is a continuation application of U.S. application Ser. No. 15/924,262, filed Mar. 18, 2018, now U.S. Pat. No. 10,515,954, issued Dec. 24, 2019, which is herein incorporated by reference in its entirety.

BACKGROUND

In deep sub-micron integrated circuit technology, an embedded static random access memory (SRAM) device has become a popular storage unit of high speed communication, image processing and system-on-chip (SOC) products. The amount of embedded SRAM in microprocessors and SOCs increases to meet the performance requirement in each new technology generation. As silicon technology continues to scale from one generation to the next, the impact of intrinsic threshold voltage (Vt) variations in minimum geometry size bulk planar transistors reduces the complimentary metal-oxide-semiconductor (CMOS) SRAM cell static noise margin (SNM). This reduction in SNM caused by increasingly smaller transistor geometries is undesirable. SNM is further reduced when Vcc is scaled to a lower voltage.

To solve SRAM issues and to improve cell shrink capability, fin field effect transistor (FinFET) devices are often considered for some applications. The FinFET provides both speed and device stability. The FinFET has a channel (referred to as a fin channel) associated with a top surface and opposite sidewalls. Benefits can be derived from the additional sidewall device width (Ion performance) as well as better short channel control (sub-threshold leakage). Therefore, FinFETs are expected to have advantages in terms of gate length scaling and intrinsic Vt fluctuation. However, existing FinFET SRAM devices still have shortcomings, for example shortcomings related to cell write margins or chip speeds.

Therefore, although existing FinFET SRAM devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates a top view of a layout corresponding to a semiconductor device according to some embodiments of the present disclosure;

FIG. 13 is a cross-section view of the I/O circuit of the semiconductor device;

FIG. 14 is a cross-section view of the first core circuit of the semiconductor device;

FIG. 15 is a cross-section view of the third core circuit of the semiconductor device;

DETAILED DESCRIPTION

Figure 1:
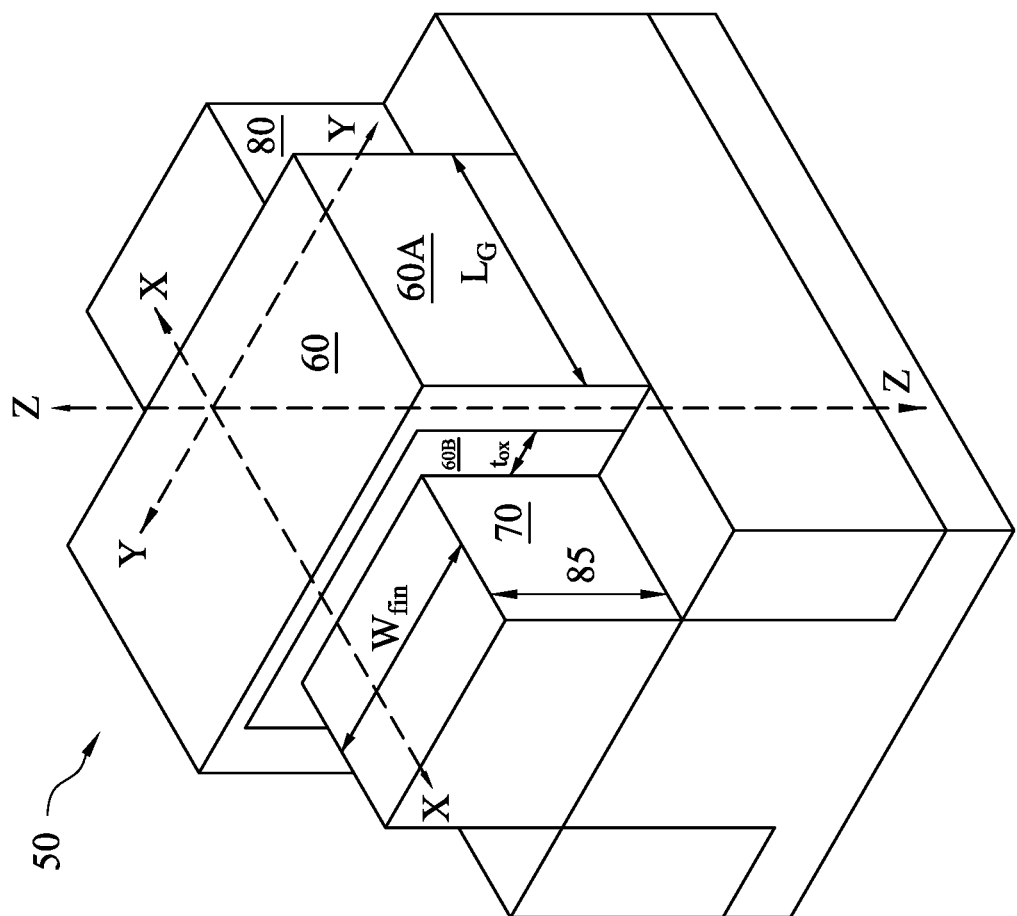
FIG. 1 illustrates a perspective view of an example FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The use of FinFET devices has been gaining popularity in the semiconductor industry. Referring to FIG. 1, which illustrates a perspective view of an example FinFET device 50. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1. The fin has a fin width $W_{fin}$ measured along a Y-direction that is orthogonal to the X-direction. In some embodiments, the fin width $W_{fin}$ of the fin may be defined as a width of the top surface of the fin measured along the Y-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction.

$L_G$ denotes a length (or width, depending on the perspective) of the gate 60 measured in the X-direction. The gate 60 may include a gate electrode component 60A and a gate dielectric component 60B. The gate dielectric 60B has a thickness $t_{ox}$ measured in the Y-direction. A portion of the gate 60 is located over a dielectric isolation structure such as shallow trench isolation (STI). A source 70 and a drain 80 of the FinFET device 50 are formed in extensions of the fin on opposite sides of the gate 60. A portion of the fin being wrapped around by the gate 60 serves as a channel of the FinFET device 50. The effective channel length of the FinFET device 50 is determined by the dimensions of the fin.

Figure 2:
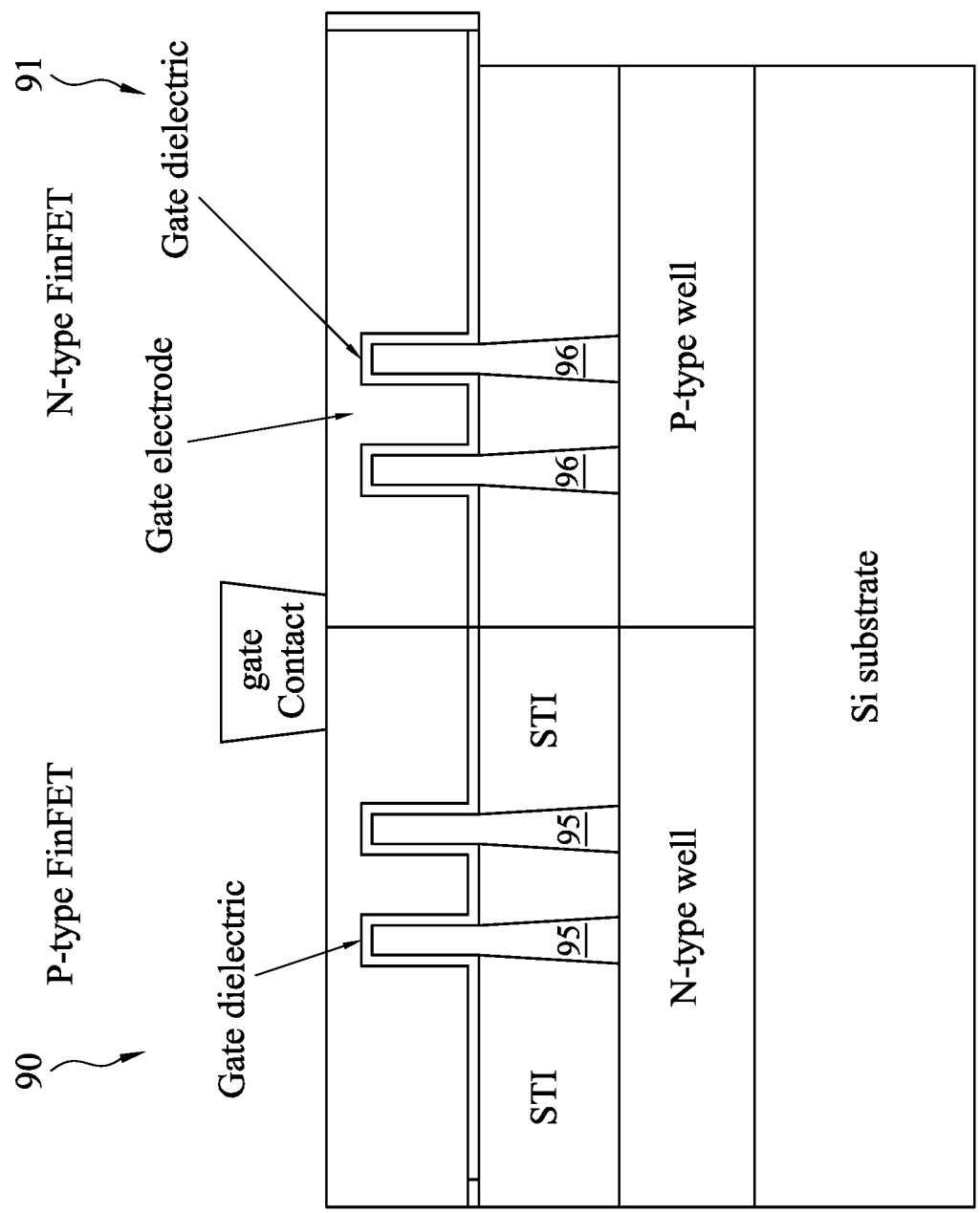
FIG. 2 illustrates a diagrammatic cross-sectional side view of FinFET transistors in a CMOS configuration.

FIG. 2 illustrates a diagrammatic cross-sectional side view of FinFET transistors in a CMOS configuration. The CMOS FinFET includes a substrate, for example a silicon substrate. An N-type well and a P-type well are formed in the substrate. A dielectric isolation structure such as a shallow trench isolation (STI) is formed over the N-type well and the P-type well. A P-type FinFET 90 is formed over the N-type well, and an N-type FinFET 91 is formed over the P-type well. The P-type FinFET 90 includes fins 95 that protrude upwardly out of the STI, and the N-type FinFET 91 includes fins 96 that protrude upwardly out of the STI. The fins 95 include the channel regions of the P-type FinFET 90, and the fins 96 include the channel regions of the N-type FinFET 91. In some embodiments, the fins 95 are comprised of silicon germanium, and the fins 96 are comprised of silicon. A gate dielectric is formed over the fins 95-96 and over the STI, and a gate electrode is formed over the gate dielectric. In some embodiments, the gate dielectric includes a high-k dielectric material, and the gate electrode includes a metal gate electrode, such as aluminum and/or other refractory metals. In some other embodiments, the gate dielectric may include SiON, and the gate electrode may include polysilicon. A gate contact is formed on the gate electrode to provide electrical connectivity to the gate.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

As illustrated in FIG. 3, which illustrates a top view of a layout 100A corresponding to a semiconductor device 100 according to some embodiments of the present disclosure. The semiconductor device 100 includes a first circuit 102 and a second circuit 104. As shown in layout 100A, the first circuit 102 and the second circuit 104 are spaced from each other by a region 106 which includes, for example, an isolation structure. In some embodiments, the first circuit 102 may be used in an input/output (I/O) device of the semiconductor device 100, and the second circuit 104 may be used in a core device of the semiconductor device 100.

The first circuit 102 includes a plurality of a first active area region 111 with fins 112, 114, 116, 118, a second active area region 121 with fins 122, 124, 126, and 128, a plurality of gate electrodes 130, 132, a plurality of spacers 134, 136, 138, 140, and a plurality of contact areas 142, 144, 146, 148.

The first and second active area regions 111 and 121 extend along a Y-direction of the layout 100A. The Y-direction of the layout 100A can be referred to as the X-direction of FIG. 1. In some embodiments, the first and second active area regions 111 and 121 are also referred to as oxide-definition (OD) regions. Example materials of the first and second active area regions 111 and 121 include, but are not limited to, semiconductor materials doped with various types of p-dopants and/or n-dopants. In some embodiments, the first and second active area regions 111 and 121 include dopants of the same type. In some embodiments, one of the first and second active area regions 111 and 121 includes dopants of a type different from a type of dopants of another one of the first and second active area regions 111 and 121. The first and second active area regions 111 and 121 are isolated from each other by one or more isolation structures as described herein. The first and second active area regions 111 and 121 are within corresponding well regions. For example, the first active area region 111 is within a well region 110 which is an n-well region in one or more embodiments, and the second active area region 121 is within a well region 120 which is a p-well region in one or more embodiments. The described conductivity of the well regions 110 and 120 is an example. Other arrangements are within the scope of various embodiments.

The n-well region 110 and the p-well region 120 are on opposite sides of an imaginary line 108A which divides the semiconductor device into separate regions for different types of devices or transistors. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains, or the like. In the example configuration in FIG. 3, the n-well region 110 is a region for forming p-channel metal-oxide semiconductor (PMOS) transistors, and the p-well region 120 is a region for forming n-channel metal-oxide semiconductor (NMOS) transistors. Each of the first and second active area regions 111 and 121 includes one or more fins to form FinFETs as described in FIGS. 1 and 2. For example, the first active area region 111 comprises the four fins 112, 114, 116, 118 and the second active area region 121 comprises the four fins 122, 124, 126, 128. The fins 112, 114, 116, 118, 122, 124, 126, 128 are isolated from each other by one or more isolation structures as described herein. Other numbers of fins in each of the first and second active area regions 111 and 121 are within the scope of various embodiments. The described FinFET configuration is an example. Other arrangements are within the scope of various embodiments. For example, in one or more embodiments, the first and second active area regions 111 and 121 may not include fins and are configured for forming planar MOSFET transistors.

The fins 112, 114, 116, 118, 122, 124, 126, 128 are extend in an elongated manner in the Y-direction. In some embodiments, the fins 112, 114, 116, 118 are parts of the PMOSFET, and the fins 122, 124, 126, 128 are parts of the NMOSFET. The PMOSFET fins 112, 114, 116, 118 are located over the n-well region 110, whereas the NMOSFET fins 122, 124, 126, 128 are located over the p-well region 120. In some embodiments, the PMOSFET fins 112, 114, 116, 118 comprise a silicon germanium (SiGe) material (for strain effect enhancement), but the NMOSFET fins 122, 124, 126, 128 comprise a non-germanium-containing semiconductor material, for example Si.

In some embodiment, at least one of the fins 112, 114, 116, 118 of the first active area region 111 and the fins 122, 124, 126 128 of the second active area region 121 has a first width measured along the X-direction as described with respect to the fin width $W_{fin}$ in FIG. 1. For example, the fin 118 of the first active area region 111 has the first width W1 measured along the X-direction. In some embodiments, a pair of the adjacent fins of the first and second active area regions 111 and 121 are spaced from each other by a first spacing measured along the X-direction. For example, the adjacent fins 122 and 124 are spaced from each other by the first spacing S1. The first spacing S1 can be referred to as a distance that is measured along the X-direction and between boundaries of the adjacent fins 122 and 124. For example, a distance measured along the X-direction from one side (e.g., the right side in FIG. 3) of the boundary of the fin 122 to the opposite side (e.g., the left side in FIG. 3) of the boundary of the fin 124 is equal to the first spacing S1.

In some embodiments, the fins of the first and second active area regions 111 and 121 can be arranged along the X-direction by a first pitch, which can be defined by a sum of the first width and the first spacing. In some embodiments, the first pitch is equal to a sum of the first width W1 of the fin 118 and the first spacing between the boundaries of the adjacent fins 116 and 118, and thus the first pitch is equal to a distance X1 measured along the X-direction from one side (e.g., the right side in FIG. 3) of the boundary of the fin 116 to the same side (e.g., the right side in FIG. 3) of the boundary of the fin 118. In some embodiments, the first pitch is equal to a sum of the first width of the fin 122 and the first spacing between the boundaries of the adjacent fins 122 and 124, and thus the first pitch is equal to a distance X1' measured along the X-direction from one side (e.g., the left side in FIG. 3) of the boundary of the fin 122 to the same side (e.g., the left side in FIG. 3) of the boundary of the fin 124. Accordingly, in some embodiments, either the distance X1 or the distance X1' can be referred to as the first pitch, and the fins of the first and second active area regions 111 and 121 are arranged along the X-direction by the first pitch.

The gate electrodes 130 and 132 extend along an X-direction of the layout 100. The X-direction of the layout 100A can be referred to as the Y-direction of FIG. 1. The gate electrodes 130 and 132 are across first and second active area regions 111 and 121. Example materials of the gate electrodes 130 and 132 include, but are not limited to, polysilicon and metal. Other materials are within the scope of various embodiments. The gate electrodes 130 and 132 and the corresponding first and second active area regions 111 and 121 form one or more transistors in the layout 100A. In the example configuration in FIG. 3, a transistor may be formed by the gate electrode 132 and the first active area region 111. In some embodiments, such transistor having a gate, a drain, and a source is formed in the first circuit 102. For example, the gate of the transistor is formed by the gate electrode 132. One of the drain or the source (referred to herein as "source/drain" or "S/D") of the transistor is defined by a region of the first active area region 111 on one side (e.g., the upper side in FIG. 3) of the gate electrode 132. The other source/drain of the transistor may be defined by another region of the first active area region 111 on the opposite side (e.g., the lower side in FIG. 3) of the gate electrode 132. For another example, a further transistor may be formed by the gate electrode 132 and the second active area region 121. In at least one embodiment, such further transistors are formed by the gate electrode 130 and the corresponding first and second active area regions 111 and 121. One or more of the gate electrodes 130 and 132 are coupled to other circuitry of the semiconductor device by corresponding gate contacts. For example, gate contacts may be formed on the corresponding gate electrodes 130 and 132 and configured to electrically couple to the corresponding gate electrodes 130 and 132 to other circuitry. Furthermore, at least one of the gate electrodes 130 and 132 has a first gate length L1 along a longitudinal direction of at least one of the first fins 112-118, 122-128 (i.e., the Y-direction of the layout 100A), as depicted in FIG. 3.

The spacers 134, 136, 138, 140 are arranged along sides of the corresponding gate electrodes 130 and 132. For example, the spacers 134 and 136 are arranged along longitudinal sides of the gate electrode 130 in the X direction, and the spacers 138 and 140 are arranged along longitudinal sides of the gate electrode 132. The spacers 134, 136, 138, 140 include one or more dielectric materials for electrically isolating the corresponding gate electrodes from unintended electrical contact. Example dielectric materials of the spacers include, but are not limited to, silicon nitride, oxynitride and silicon carbide. In at least one embodiment, one or more of the spacers 134, 136, 138, 140 may have a tapered profile as described herein.

The contact areas 142, 144, 146, 148 overlap the corresponding first and second active area regions 111 and 121. For example, the contact areas 142, 146 overlap the first active area region 111, and the contact areas 144, 148 overlap the second active area region 121. The contact areas 142, 144, 146, 148 are configured to electrically couple the underlying source/drains of the corresponding transistors with each other or with other circuitry of the semiconductor device 100.

In the example configuration in FIG. 3, the boundaries of one or more of the contact areas 142, 144, 146, 148 are spaced from boundaries of the spacers 134, 136, 138, 140. For example, an upper edge of the contact area 142 is spaced in the Y-direction from an adjacent lower edge of the spacer 136, and a lower edge of the contact area 142 is spaced in the Y-direction from an adjacent upper edge of the spacer 138. Other arrangements are within the scope of various embodiments. For example, in one or more embodiments, one or more of the contact areas are self-aligned contacts (SAC) having boundaries defined at least partially by the boundaries of the spacers 134, 136, 138, 140.

The second circuit 104 includes a plurality of a third active area region 151 with fins 152, 154, 156, 158, a fourth active area region 161 with fins 162, 164, 166, and 168, a plurality of gate electrodes 170, 172, a plurality of spacers 174, 176 178, 180, and a plurality of contact areas 182, 184, 186, 188, 190, 192.

The third and fourth active area regions 151 and 161 extend along the Y-direction of the layout 100A. In some embodiments, the third and fourth active area regions 151 and 161 are also referred to as OD regions. Example materials of the third and fourth active area regions 151 and 161 include, but are not limited to, semiconductor materials doped with various types of p-dopants and/or n-dopants. In some embodiments, the third and fourth active area regions 151 and 161 include dopants of the same type. In some embodiments, one of the third and fourth active area regions 151 and 161 includes dopants of a type different from a type of dopants of another one of the third and fourth active area regions 151 and 161. The third and fourth active area regions 151 and 161 are isolated from each other by one or more isolation structures as described herein. The third and fourth active area regions 151 and 161 are within corresponding well regions. For example, the third active area region 151 is within a well region 150 which is an n-well region in one or more embodiments, and the fourth active area region 161 is within a well region 160 which is a p-well region in one or more embodiments. The described conductivity of the well regions 150 and 160 is an example. Other arrangements are within the scope of various embodiments.

The n-well region 150 and the p-well region 160 are on opposite sides of an imaginary line 108B which divides the semiconductor device into separate regions for different types of devices or transistors. Examples of transistors include, but are not limited to, MOSFET, CMOS transistors, BJT, high voltage transistors, high frequency transistors, PFETs and/or NFETs, FinFETs, planar MOS transistors with raised source/drains, or the like. In the example configuration in FIG. 3, the n-well region 150 is a region for forming PMOS transistors, and the p-well region 160 is a region for forming NMOS transistors. Each of the third and fourth active area regions 151 and 161 includes one or more fins to form FinFETs as described in FIGS. 1 and 2. For example, the third active area region 151 comprises the four fins 152, 154, 156, 158 and the fourth active area region 161 comprises the four fins 162, 164, 166, 168. The fins 152, 154, 156, 158, 162, 164, 166, 168 are isolated from each other by one or more isolation structures as described herein. Other numbers of fins in each of the third and fourth active area regions 151 and 161 are within the scope of various embodiments. The described FinFET configuration is an example. Other arrangements are within the scope of various embodiments. For example, in one or more embodiments, the third and fourth active area regions 151 and 161 may not include fins and are configured for forming planar MOSFET transistors.

The fins 152, 154, 156, 158, 162, 164, 166, 168 are extend in an elongated manner in the Y-direction. In some embodiments, the fins 152, 154, 156, 158 are parts of the PMOS-FET, and the fins 162, 164, 166, 168 are parts of the NMOSFET. The PMOSFET fins 152, 154, 156, 158 are located over the n-well region 150, whereas the NMOSFET fins 162, 164, 166, 168 are located over the p-well region 160. In some embodiments, the PMOSFET fins 152, 154, 156, 158 comprise a silicon germanium (SiGe) material (for strain effect enhancement), but the NMOSFET fins 162, 164, 166, 168 comprise a non-germanium-containing semiconductor material, for example Si.

In some embodiment, at least one of the fins 152, 154, 156, 158 of the third active area region 151 and the fins 162, 164, 166 168 of the fourth active area region 161 has a second width measured along the X-direction as described with respect to the fin width $W_{fin}$ in FIG. 1. For example, the fin 158 of the third active area region 151 has the second width W2 measured along the X-direction. In some embodiments, a pair of the adjacent fins of the third and fourth active area regions 151 and 161 are spaced from each other by a second spacing measured along the X direction. For example, the adjacent fins 162 and 164 are spaced from each other by the second spacing S2. The second spacing S2 can be referred to as a distance that is measured along the X-direction and between boundaries of the adjacent fins 162 and 164. For example, a distance measured along the X-direction from one side (e.g., the right side in FIG. 3) of the boundary of the fin 162 to the opposite side (e.g., the left side in FIG. 3) of the boundary of the fin 164 is equal to the second spacing S2.

In some embodiments, the fins of the third and fourth active area regions 151 and 161 can be arranged along the X-direction by a second pitch, which can be defined by a sum of the second width and the second spacing. In some embodiments, the second pitch is equal to a sum of the second width W2 of the fin 158 and the second spacing between the boundaries of the adjacent fins 156 and 158, and thus the second pitch is equal to a distance X2 measured along the X-direction from one side (e.g., the right side in FIG. 3) of the boundary of the fin 156 to the same side (e.g., the right side in FIG. 3) of the boundary of the fin 158. In some embodiments, the second pitch is equal to a sum of the second width of the fin 162 and the second spacing between the boundaries of the adjacent fins 162 and 164, and thus the second pitch is equal to a distance X2' measured along the X-direction from one side (e.g., the left side in FIG. 3) of the boundary of the fin 162 to the same side (e.g., the left side in FIG. 3) of the boundary of the fin 164. Accordingly, in some embodiments, either the distance X2 or the distance X2' can be referred to as the second pitch, and the fins of the third and fourth active area regions 151 and 161 are arranged along the X-direction by the second pitch.

The gate electrodes 170 and 172 extend along the X-direction of the layout 100A and are across the third and fourth active area regions 151 and 161. Example materials of the gate electrodes 170 and 172 include, but are not limited to, polysilicon and metal. Other materials are within the scope of various embodiments. The gate electrodes 170 and 172 and the corresponding third and fourth active area regions 151 and 161 form one or more transistors in the layout 100A. In the example configuration in FIG. 3, a transistor may be formed by the gate electrode 172 and the third active area region 151. In some embodiments, such transistor having a gate, a drain, and a source is formed in the second circuit 104. The gate of the transistor is formed by the gate electrode 172. One of the drain or the source (referred to herein as "source/drain" or "S/D") of the transistor is defined by a region of the third active area region 151 on one side (e.g., the upper side in FIG. 3) of the gate electrode 172. The other source/drain of the transistor is defined by another region of the third active area region 151 on the opposite side (e.g., the lower side in FIG. 3) of the gate electrode 172. For another example, a further transistor may be formed by the gate electrode 172 and the fourth active area region 161. In at least one embodiment, further transistors are formed by the gate electrode 170 and the corresponding third and fourth active area regions 151 and 161. One or more of the gate electrodes 170 and 172 are coupled to other circuitry of the semiconductor device by corresponding gate contacts. For example, gate contacts may be formed on the corresponding gate electrodes 170 and 172 and configured to electrically couple to the corresponding gate electrodes 170 and 172 to other circuitry. Furthermore, at least one of the gate electrodes 170 and 172 has a second gate length L2 along a longitudinal direction of at least one of the second fins 152-158, 162-168 (i.e., the Y-direction of the layout 100A), as depicted in FIG. 3. In some embodiments, a ratio of the first gate length L1 to the second gate length L2 is greater than 2. In some embodiments, a ratio of the first gate length L1 to the second gate length L2 is in a range from 2 to 20. In some embodiments, a center-to-center distance or spacing in the Y-direction between the gate electrodes 170 and 172 is less than a center-to-center distance or spacing in the Y-direction between the gate electrodes 130 and 132.

The spacers 174, 176, 178, 180 are arranged along sides of the corresponding gate electrodes 170 and 172. For example, the spacers 174 and 176 are arranged along longitudinal sides of the gate electrode 170 in the X direction, and the spacers 178 and 180 are arranged along longitudinal sides of the gate electrode 172. The spacers 174, 176, 178, 180 include one or more dielectric materials for electrically isolating the corresponding gate electrodes from unintended electrical contact. Example dielectric materials of the spacers include, but are not limited to, silicon nitride, oxynitride and silicon carbide. In at least one embodiment, one or more of the spacers 174, 176, 178, 180 have a tapered profile as described herein.

The contact areas 182, 184, 186, 188, 190, 192 overlap the corresponding third and fourth active area regions 151 and 161. For example, the contact areas 182, 186, 190 overlap the third active area region 151, and the contact areas 184, 188, 192 overlap the fourth active area region 161. The contact areas 182, 184, 186, 188, 190, 192 are configured to electrically couple the underlying source/drains of the corresponding transistors with each other or with other circuitry of the semiconductor device 100.

In the example configuration in FIG. 3, boundaries of one or more of the contact areas 182, 184, 186, 188, 190, 192 are spaced from boundaries of the spacers 174, 176, 178, 180. For example, an upper edge of the contact area 186 is spaced in the Y direction from an adjacent lower edge of the spacer 176, and a lower edge of the contact area 186 is spaced in the Y direction from an adjacent upper edge of the spacer 178. Other arrangements are within the scope of various embodiments. For example, in one or more embodiments, one or more of the contact areas are SAC having boundaries defined at least partially by boundaries of the spacers 174, 176, 178, 180.

Figure 4:
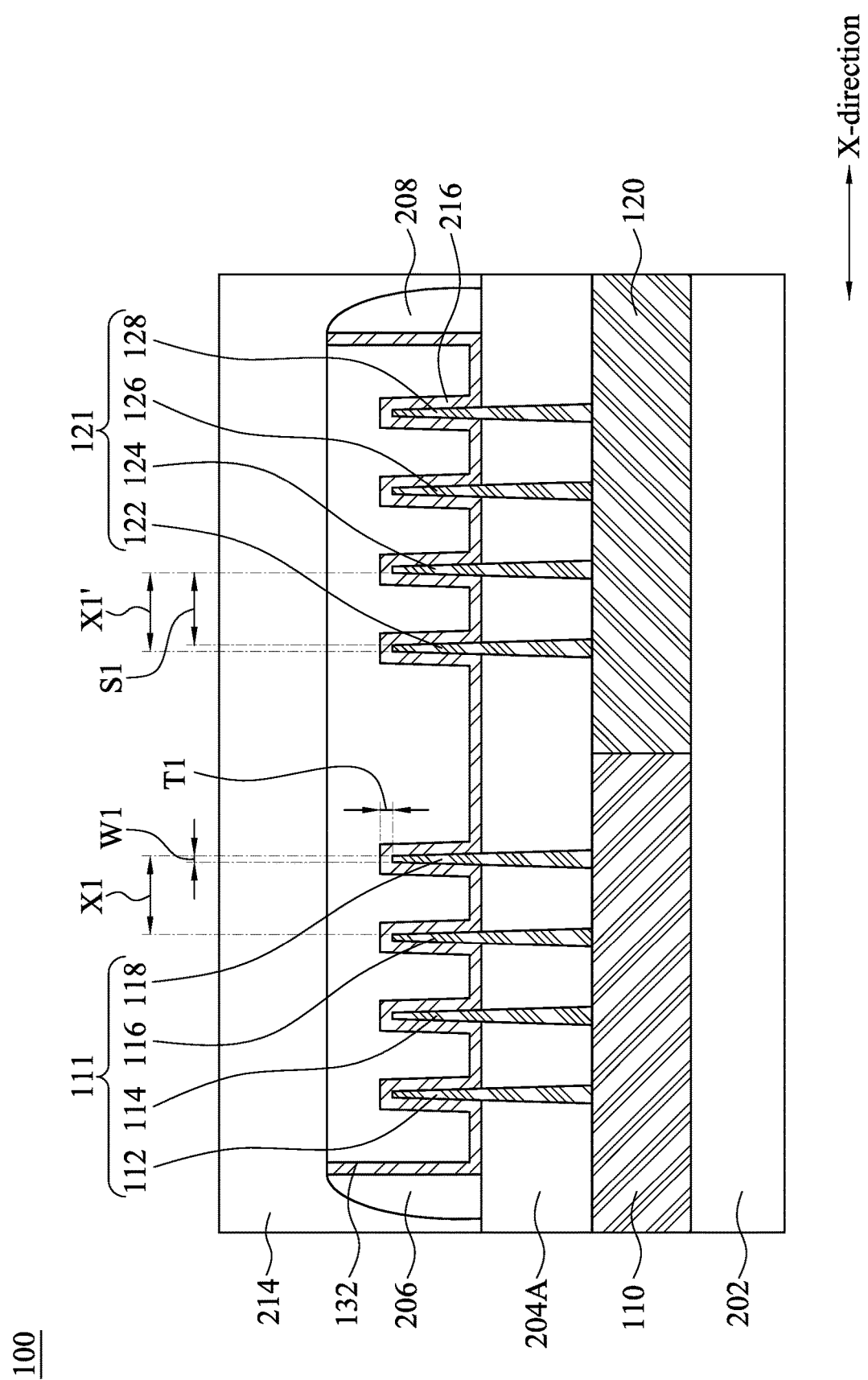
FIG. 4 is a cross-section view taken along line 4-4 in FIG. 3.
Figure 5:
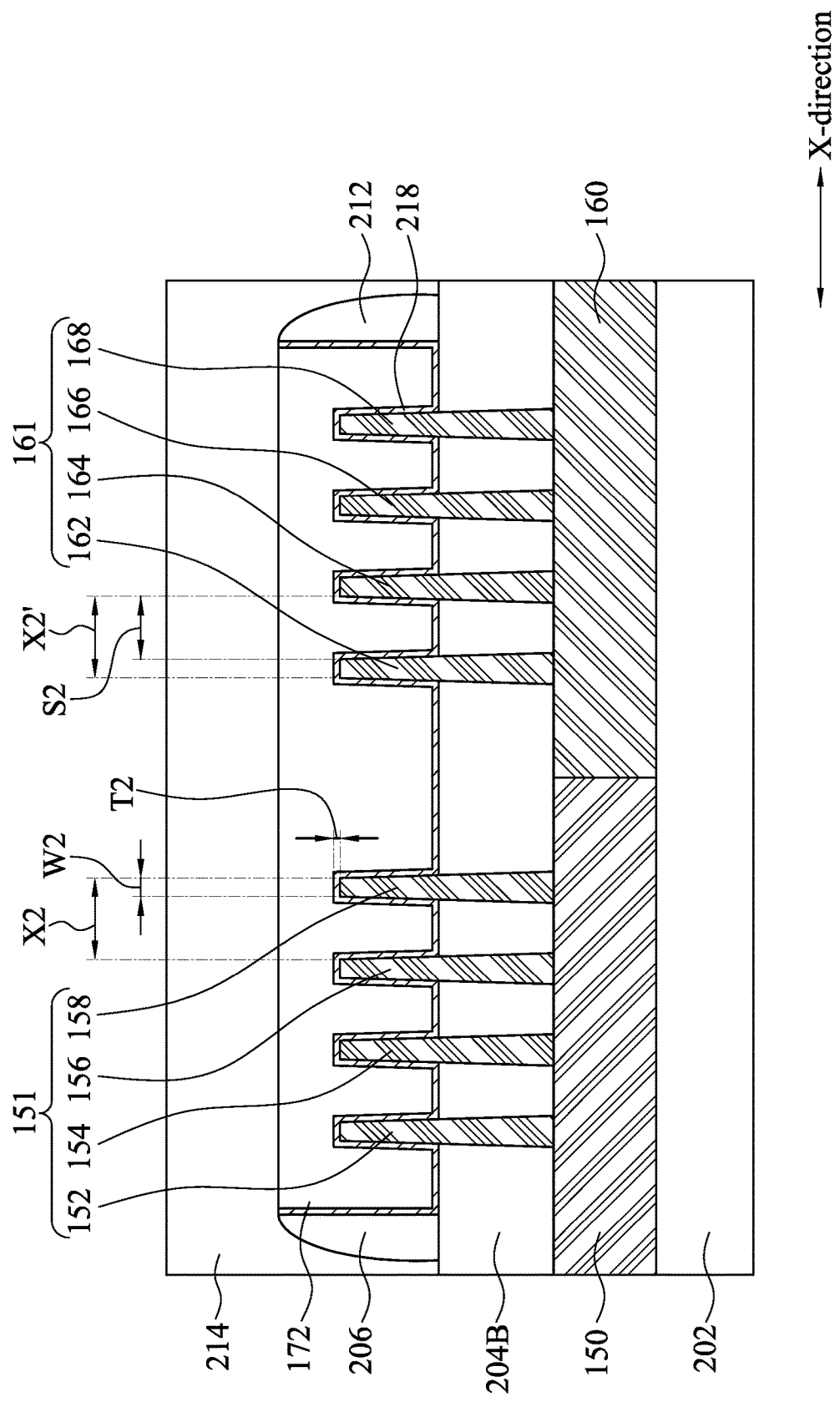
FIG. 5 is a cross-section view taken along line 5-5 in FIG. 3.

Reference is made to FIGS. 4 and 5. FIG. 4 is a cross-section view taken along line 4-4 in FIG. 3. FIG. 5 is a cross-section view taken along line 5-5 in FIG. 3. The configuration of the semiconductor device is described herein with respect to both FIGS. 4 and 5. The structures shown in FIGS. 4 and 5 can be formed by modelling in a layout as depicted in FIG. 3, and then physical elements or layers are formed by using the gate electrode and the gate contact as patterns.

As illustrated in FIGS. 4 and 5, the semiconductor device 100 comprises a substrate 202 over which various elements of the semiconductor device 100 are formed. The elements of the semiconductor device 100 include active elements and/or passive elements. In at least one embodiment, active elements are arranged in a circuit region of the semiconductor device to provide one or more functions and/or operations intended to be performed by the semiconductor device. In at least one embodiment, the semiconductor device further comprises a non-circuit region, e.g., a sealing region that extends around and protects the circuit region. Examples of active elements include, but are not limited to, transistors and diodes. Examples of transistors are described herein with respect to FIG. 3. Examples of passive elements include, but are not limited to, capacitors, inductors, fuses, and resistors. A plurality of metal layers and via layers are alternatingly formed over the substrate 202 to electrically couple the elements of the semiconductor device 100 with each other and/or with external devices. The substrate 202 comprises, in at least one embodiment, a silicon substrate. The substrate 202 comprises, in at least one embodiment, silicon germanium (SiGe), Gallium arsenic, P-type doped Si, N-type doped Si, or suitable semiconductor materials. For example, semiconductor materials including group III, group IV, and group V elements are within the scope of various embodiments. In some embodiments, the substrate 202 further includes one or more other features, such as various doped regions, a buried layer, and/or an epitaxy (epi) layer. In some embodiments, the substrate 202 comprises a semiconductor on insulator, such as silicon on insulator (SOI). In some embodiments, the substrate 202 includes a doped epi layer, a gradient semiconductor layer, and/or a semiconductor layer overlying another semiconductor layer of a different type such as a silicon layer on a silicon germanium layer.

The semiconductor device 100 further comprises one or more well regions over the substrate 202. In the example configuration in FIG. 4, the n-well region 110 and p-well region 120 are over the substrate 202, as described with respect to FIG. 3. In the example configuration in FIG. 5, the n-well region 150 and p-well region 160 are over the substrate 202, as described with respect to FIG. 3.

The semiconductor device 100 further comprises one or more isolation structures over and around the well regions 110, 120, 150, 160. In the example configuration in FIGS. 4 and 5, the isolation structure 204A is over the well regions 110, 120, and the isolation structure 204B is over the well regions 150, 160. The isolation structures 204A and 204B electrically isolate various elements of the semiconductor device 100 from each other. For example, as illustrated in FIG. 4, the isolation structure 204A electrically isolates the fins 112, 114, 116, 118 in the first active area region 111 from the fins 122, 124, 126, 128 in the second active area region 121. Similarly, as illustrated in FIG. 5, the isolation structure 204B electrically isolates the fins 152, 154, 156, 158 in the third active area region 151 from the fins 162, 164, 166, 168 in the fourth active area region 161. In some embodiments, in the cross-section in FIGS. 4 and 5, at least one of the isolation structures 204A, 204B may have a thickness less than at least one of the fins 112-118, 122-128, 152-158, 162-168. In some embodiments, outside the cross-section shown in FIGS. 4 and 5, at least one of the isolation structures 204A, 204B may include regions where the thickness thereof is higher than at least one of the corresponding fins 112-118, 122-128, 152-158, 162-168. In at least one embodiment, at least one of the isolation structures 204A, 204B comprises one or more shallow trench isolation (STI) regions. Example materials of the STI regions include, but are not limited to, silicon oxide, silicon nitride, silicon oxynitride, fluoride-doped silicate, and/or any other low k dielectric materials. In some embodiments, the STI thickness is from 50 nm to 200 nm. In some embodiments, the isolation structures 204A, 204B may have the sane or different materials.

The semiconductor device 100 further comprises active area regions, gate electrodes, and corresponding spacers over the isolation structure. In the example configuration in FIGS. 4 and 5, the semiconductor device 100 further comprises the first, second, third, fourth active area regions 111, 121, 151, 161, the gate electrodes 132, 172, and corresponding spacers 206, 208, 210, 212 over the corresponding isolation structures 204A and 204B. Other arrangements are within the scope of various embodiments. For example, in one or more embodiments, the gate electrodes 132, 172, and/or one or more of the corresponding spacers 206, 208, 210, 212 are partially embedded in the corresponding isolation structures 204A and 204B.

In some embodiments, the semiconductor device 100 further comprises an inter-layer dielectric (ILD) layer 214 over the isolation structures 204A, 204B. Example materials of the ILD layer 214 include, but are not limited to, $SiN_x$, $SiO_x$, SiON, SiC, SiBN, SiCBN, or combinations thereof. The ILD layer 214 embeds therein the gate electrodes 132, 172 and/or the corresponding spacers 206, 208, 210, 212. The ILD layer 214 further embeds therein the fins 112-118, 122-128, 152-158, 162-168 of the first, second, third, fourth active area regions 111, 121, 151, 161 and the contact plugs in the corresponding contact areas 142, 144, 146, 148, 182, 184, 186, 188, 190, 192 of FIG. 3.

In the example configuration in FIG. 4, the gate electrode 132 wraps over the fins 112-118 and 122-128 of the first and second active area regions 111, 121 in regions where the gate electrode 132 crosses over the fins 112-118 and 122-128. The spacers 206, 208 may adhere to opposite sidewalls of the gate electrode 132. To electrically isolate the gate electrode 132 from the fins 112-118 and 122-128, a first gate dielectric layer 216 is arranged under and around the gate electrode 132, in which the fins 112-118 and 122-128 are covered by the gate dielectric layer 216. The spacers 138, 140 of FIG. 3 may be over opposite sides of the first gate dielectric layer 216. Example materials of the gate dielectric layer include, but are not limited to, a high-k dielectric layer, an interfacial layer, and/or combinations thereof. Example materials for the high-k dielectric layer include, but are not limited to, silicon nitride, silicon oxynitride, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, suitable high-k dielectric materials, and/or combinations thereof. In at least one embodiment, a gate dielectric layer includes multi-layer structure of, for example, $SiO_2$ with a high-k dielectric, or SiON with a high-k dielectric.

In the example configuration in FIG. 4, the gate electrode 132 is wrapped over the fins 112-118 and 122-128, and includes a first conductive gate material over the n-well region 110 and a second conductive gate material over the p-well region 120. In at least one embodiment, the conductive gate materials include the same conductive material. In at least one embodiment, the conductive gate materials include different conductive materials. In at least one embodiment, the conductive material or materials of at least one of the conductive gate materials is/are selected in accordance with the type of device or transistor. For example, each of the first and second conductive gate materials includes a first conductive work function layer and a first contact layer over the first conductive work function layer.

In at least one embodiment, the first work function layer is configured to have a first work function in a range from 4 eV to 5 eV. In some embodiments, the first conductive gate material includes a p-type work function metal (p-metal) for forming a PMOS over the n-well region 110. Example p-metals include, but are not limited to, TiN, TaN, a carbon-doped metal nitride such as TaCN. In some embodiments, the second conductive gate material includes an n-type work function metal (n-metal) for forming an NMOS over the p-well region 120. Example n-metals include, but are not limited to, Ta, TiAl, and TiAlN. Other work function materials are within the scope of various embodiments. For example, in one or more embodiments, the first work function layer comprises doped conducting oxide materials, TaAl, TiSi, NiSi, PtSi, suitable Ti containing work function materials, suitable Ta containing work function materials, suitable Al containing work function materials, and suitable W containing work function materials.

In at least one embodiment, the first contact layer over the first conductive work function layer is configured to have a low contact resistance. Example materials of the first contact layer include, but are not limited to, polysilicon with silicide, refractory materials such as TiN, TaN, TiW, and TiAl, suitable Ti containing work function materials, suitable Ta containing work function materials, suitable Al containing work function materials, suitable W containing work function materials, suitable Cu containing work function materials, and suitable N containing work function materials.

The first conductive gate material and the second conductive gate material are isolated from the fins 112-118 and 122-128 by the first gate dielectric layer 216 over the n-well region 110 and the p-well region 120. In at least one embodiment, the first gate dielectric layer 216 has a first portion over the n-well region 110 and a second portion over the p-well region 120. In some embodiments, the first and second portions of the first gate dielectric layer 216 include the same dielectric material. In some embodiments, the first and second portions of the first gate dielectric layer 216 include different dielectric materials. In some embodiments, the gate electrode 132 extends continuously from the n-well region 110 into the p-well region 120, and the first conductive gate material is in contact with the second conductive gate material. Other arrangements are within the scope of various embodiments. For example, in at least one embodiment, at least one of the first and second portions of the first gate dielectric layer 216 is interposed between and electrically isolates the first and second conductive gate materials. In at least one embodiment, at least one of the first and second portions of the first gate dielectric layer 216 includes one or more of $HfO_2$, $Ta_2O_5$ and $Al_2O_3$.

In at least one embodiment, the first work function layer, the first contact layer and the first gate dielectric layer configure a gate stack structure. Examples of gate stack structures include, but are not limited to, a metals/high-K dielectric structure, an Al/refractory metals/high-K dielectric structure, a W/refractory metals/high-K dielectric structure, a Cu/refractory metals/high-K dielectric structure, and a silicide/high-K dielectric structure. In at least one embodiment, the gate stack structure includes a $Si_3N_4$/metals/high-K dielectric structure in which the metals are selected from the group consisting of Al/refractory metals, W/refractory metals, Cu/refractory metals, silicide, and combinations thereof.

In the example configuration in FIG. 5, the gate electrode 172 wraps over the fins 152-158 and 160-168 of the third and fourth active area regions 150, 160 in regions where the gate electrode 172 crosses over the fins 152-158 and 160-168. The spacers 210, 212 may adhere to opposite sidewalls of the gate electrode 172. To electrically isolate the gate electrode 172 from the fins 152-158 and 160-168, a second gate dielectric layer 218 is arranged under and around the gate electrode 172. The spacers 178, 180 of FIG. 3 may be over opposite sides of the second gate dielectric layer 218. Example materials of the second gate dielectric layer 218 may be similar to those of the first gate dielectric layer 216.

In the example configuration in FIG. 5, the gate electrode 172 is wrapped over the fins 152-158 and 160-168, and includes a first conductive gate material over the n-well region 150 and a second conductive gate material over the p-well region 160, which are similar to those of the gate electrode 132. Similarly, the conductive material or materials of at least one of the conductive gate materials of the gate electrode 172 is/are selected in accordance with the type of device or transistor. For example, each of the first and second conductive gate materials the gate electrode 172 includes a second conductive work function layer and a second contact layer over the second conductive work function layer. Properties and configurations of the second conductive work function layer and the second contact layer of the gate electrode 172 may be similar to those of the first conductive work function layer and the first contact layer of the gate electrode 132.

The first conductive gate material and the second conductive gate material are isolated from the fins 152-158 and 162-168 by the second gate dielectric layer 218 over the n-well region 150 and the p-well region 160. In at least one embodiment, the second gate dielectric layer 218 has a first portion over the n-well region 150 and a second portion over the p-well region 160. In some embodiments, the first and second portions of the second gate dielectric layer 218 include the same dielectric material. In some embodiments, the first and second portions of the second gate dielectric layer 218 include different dielectric materials. In some embodiments, the gate electrode 172 extends continuously from the n-well region 150 into the p-well region 160, and the first conductive gate material of the gate electrode 172 is in contact with the second conductive gate material of the gate electrode 172. Other arrangements are within the scope of various embodiments. For example, in at least one embodiment, at least one of the first and second portions of the of the second gate dielectric layer 218 is interposed between and electrically isolates the first and second conductive gate materials of the gate electrode 172. In at least one embodiment, at least one of the first and second portions of the of the second gate dielectric layer 218 includes one or more of $HfO_2$, $Ta_2O_5$ and $Al_2O_3$.

In at least one embodiment, the second work function layer, the second contact layer and the second gate dielectric layer configure a gate stack structure. Examples of gate stack structures include, but are not limited to, a metals/high-K dielectric structure, an Al/refractory metals/high-K dielectric structure, a W/refractory metals/high-K dielectric structure, a Cu/refractory metals/high-K dielectric structure, and a silicide/high-K dielectric structure. In at least one embodiment, the gate stack structure includes a $Si_3N_4$/metals/high-K dielectric structure in which the metals are selected from the group consisting of Al/refractory metals, W/refractory metals, Cu/refractory metals, silicide, and combinations thereof.

Reference is made to FIG. 4. Each of the fins 112-118 and 122-128 of the first and second active area regions 111, 121 has the first width as depicted in FIG. 3. For example, the top surface of the fin 118 of the first active area region 111 has the first width W1 measured along an X-direction of FIG. 4 (i.e., the X-direction of FIG. 3). Either a pair of the adjacent fins 112-118 of the first active area region 111 or a pair of the adjacent fins 122-128 of the second active area region 121 are spaced from each other by the first spacing in the X direction, as depicted in FIG. 3. For example, the adjacent fins 122 and 124 are spaced from each other by the first spacing S1, in which the first spacing S1 can be referred to as a distance that is measured from one side (e.g., the right side in FIG. 4) of the boundary of the top surface of the fin 122 and the opposite side (e.g., the left side in FIG. 4) of the boundary of the top surface of the fin 124. Similarly, in either of the first active area region 111 or the second active area region 121, the fins can be arranged along the X-direction by the first pitch, as depicted in FIG. 3. The first pitch can be defined by the sum of the first width and the first spacing. For example, the fins 116, 118 of the first active area region 111 are arranged along the X-direction by the distance X1, and the fins 122, 124 of the second active area region 121 are arranged along the X-direction by the distance X1' which is equal to the distance X1. Furthermore, the first gate dielectric layer 216 covering the fins 112-118 and 122-128 has a first thickness T1. In some embodiments, the first thickness T1 of the first gate dielectric layer 216 can be referred to as a height thereof measured from the top surface of one of the fins 112-118 and 122-128. For example, the first thickness T1 of the first gate dielectric layer 216 can be referred to as a distance from the top surface of the fin 112 to the top surface of the first gate dielectric layer 216.

Reference is made to FIG. 5. Each of the fins 152-158 and 162-168 of the third and fourth active area regions 151, 161 has the second width as depicted in FIG. 3. For example, the top surface of the fin 158 of the third active area region 151 has the second width W2 measured along an X-direction of FIG. 5 (i.e., the X-direction of FIG. 3). Either a pair of the adjacent fins 152-158 of the third active area region 151 or a pair of the adjacent fins 162-168 of the fourth active area region 161 are spaced from each other by the second spacing in the X direction, as depicted in FIG. 3. For example, the adjacent fins 162 and 164 are spaced from each other by the second spacing S2, in which the second spacing S2 can be referred to as a distance that is measured from one side (e.g., the right side in FIG. 5) of the boundary of the top surface of the fin 162 and the opposite side (e.g., the left side in FIG. 5) of the boundary of the top surface of the fin 164. Similarly, in either of the third active area region 151 or the fourth active area region 161, the fins can be arranged along the X-direction by the second pitch, as depicted in FIG. 3. The second pitch can be defined by the sum of the second width and the second spacing. For example, the fins 156, 158 of the third active area region 151 are arranged along the X-direction by the distance X2, and the fins 162, 164 of the fourth active area region 161 are arranged along the X-direction by the distance X2' which is equal to the distance X2. Furthermore, the second gate dielectric layer 218 covering the fins 152-158 and 162-168 has a second thickness T2. In some embodiments, the first thickness T2 of the second gate dielectric layer 218 can be referred to as a height thereof measured from the top surface of one of the fins 152-158 and 162-168. For example, the second thickness T2 of the second gate dielectric layer 218 can be referred to as a distance from the top surface of the fin 152 to the top surface of the second gate dielectric layer 218.

Reference is made to FIGS. 4 and 5. The first thickness T1 of the first gate dielectric layer 216 is greater than the second thickness T2 of the second gate dielectric layer 218. For example, a ratio of the first thickness T1 of the first gate dielectric layer 216 to the second thickness T2 of the second gate dielectric layer 218 is greater than 1.3. In some embodiments, a ratio of the first thickness T1 of the first gate dielectric layer 216 to the second thickness T2 of the second gate dielectric layer 218 is in a range from 1.3 to 2. Such thickness difference may be advantageous to provide various isolations suitable for different device that have different functions. For example, the first circuit 102 (see FIG. 3) used in the I/O device and the second circuit 104 (see FIG. 3) used in the core device may provide different functions and have different device characteristics, such as device dimensions, driving currents, threshold voltages, device densities, and so forth. The thickness difference between the first and second gate dielectric layers 216, 218 is thus advantageous to provide suitable isolations for the I/O device and the core device. Stated differently, with the thickness difference between the first and second gate dielectric layers 216, 218, the I/O device can be operated at a voltage higher than that of the core device.

In some embodiments, the first width W1 of at least one of the fins 112-118 and 122-128 is less than the second width W2 of at least one of the fins 152-158 and 162-168. In some embodiments, a ratio of the second width W2 of at least one of the fins 152-158 and 162-168 to the first width W1 of at least one of the fins 112-118 and 122-128 is equal to or greater than 1.05. In some embodiments, a ratio of the second width W2 of at least one of the fins 152-158 and 162-168 to the first width W1 of at least one of the fins 112-118 and 122-128 is equal to or greater than 1.1. In some embodiments, a ratio of the second width W2 of at least one of the fins 152-158 and 162-168 to the first width W1 of at least one of the fins 112-118 and 122-128 is in arrange from 1.05 to 1.3. In some embodiments, the first spacing S1 is greater than the second spacing S2. Accordingly, due to that the first width W1 is less than the second width W2 and the first spacing S1 is greater than the second spacing S2, the first pitch can be equal to the second pitch (i.e., the first pitch and the second pitch are substantially the same). For example, the first pitch and the second pitch may be less than about 32 nm. With such dimension configurations, although the first thickness T1 of the first gate dielectric layer 216 is greater than the second thickness T2 of the second gate dielectric layer 218, the space between a pair of the adjacent fins 112-118 and 122-128 of the first and second active area regions 111, 121 is sufficient to be filled with the gate electrode 132, which may include the first work function layer and the first contact layer. As such, either shrinking the pattern layout dimension or being sufficient to fill the space the adjacent fins of the I/O device with the gate electrode 132 is achieved.

Reference is made to FIG. 3. In the semiconductor device 100, the contact plugs are arranged in the spaces between adjacent spacers. For the sake of simplicity, the contact plugs are designated by the same reference numerals of the corresponding contact areas. The contact plugs 142, 144, 146, 148, 182, 184, 186, 188, 190, and 192 are shown in FIG. 3. In the semiconductor device 100, the contact plugs 142, 144, 146, 148, 182, 184, 186, 188, 190, and 192 are in contact with corresponding source/drain (S/D) features. In the example configuration in FIG. 3, at least one of the fins 112-118, 122-128, 152-158 and 162-168 includes S/D features which are in contact with at least one of the contact plugs 142-148, 182-192. In one or more embodiments, portions of at least one of the fins 112-118, 122-128, 152-158 and 162-168 between the adjacent spacers are recessed to form S/D cavities having bottom surfaces lower than the top surface of the corresponding fin. After the formation of the S/D cavities, S/D features are produced by epi-growing a strained material in the S/D cavities. In at least one embodiment, the lattice constant of the strained material is different from the lattice constant of the substrate 202 (see FIGS. 4 and 5). Thus, channel regions of the semiconductor device 100 are strained or stressed to enhance carrier mobility of the device. For example, for a PMOS device, the strained material is configured to apply a compressive stress to enhance hole mobility in the at least one source or drain region of the PMOS device. For an NMOS device, the strained material is configured to apply a tensile stress to enhance electron mobility in the at least one source or drain region of the PMOS device. Examples of the strained material include, but are not limited to, SiGe, SiGeC, SiC, GeSn, SiGeSn, SiP, SiCP and other suitable materials. In at least one embodiment, the strained material for a PMOS device comprises SiGe, SiGeC, Ge, Si, or a combination thereof. In at least one embodiment, the strained material for an NMOS device comprises SiC, SiP, SiCP, Si, or a combination thereof. In the example configuration in FIG. 3, upper surfaces of the strained material in the S/D features extend upward above top surface of the corresponding fin. Other arrangements are within the scope of various embodiments. For example, in at least one embodiment, upper surfaces of the strained material in the S/D features are lower than the top surface of the corresponding fin.

In some embodiments, the layout 100A is represented by a plurality of masks generated by one or more processors and/or stored in one or more non-transitory computer-readable media. Other formats for representing the layout 100A are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like. For example, the layout 100A is presented by at least one first mask corresponding to the first, second, third, fourth active area regions 111, 121, 151, 161, at least one second mask corresponding to the gate electrodes 130, 132, 170, 172, and at least one third mask corresponding to the spacers 134, 136, 138, 140, 174, 176, 178, 180.

Figure 6:
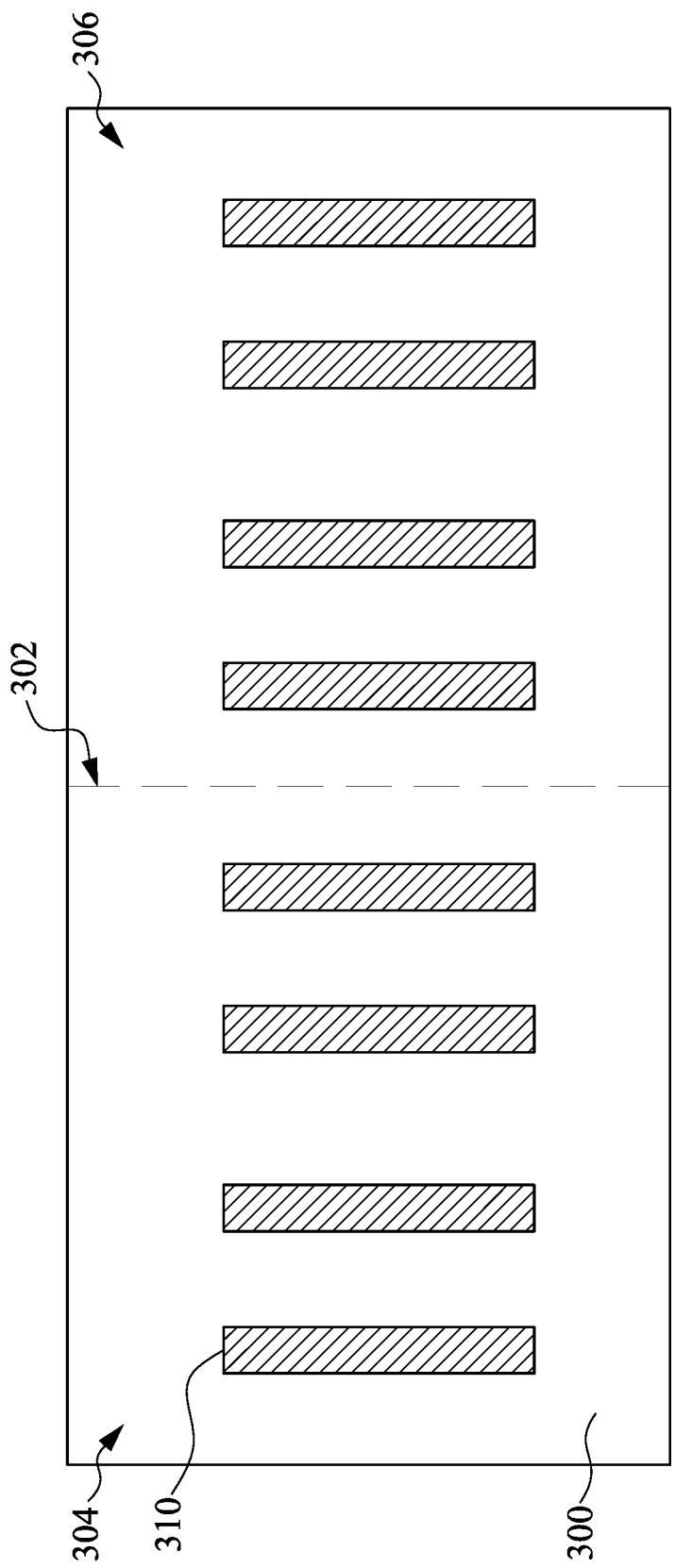
FIGS. 6-11 are plan views of formation of the fins depicted in FIG. 3

FIGS. 6-11 are plan views of formation of the fins depicted in FIG. 3. As shown in FIG. 6, an imaginary line 302 may divide a substrate 300 into separate regions for different types of devices or transistors. For example, a first region 304 for forming a I/O circuit and a second region 306 for forming a core circuit can be defined by the imaginary line 302. In some embodiments, the first region 304 may abut against the second region 306. In some embodiments, the first region 304 and the second region 306 may be spaced apart from each other. In some embodiments, the substrate 300 is a silicon substrate. In some embodiments, the substrate 300 is similar to the substrate 202 depicted in FIGS. 4 and 5. A plurality of dummy patterns 310 are formed on the substrate 300. The dummy patterns 310 may be formed by a series of operations including deposition, photolithography patterning, and etching processes. For example, a dielectric layer may be formed by a deposition process, and then the dielectric layer is etched to form the dummy patterns 310. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching). In some embodiments, the dielectric layer for forming the dummy patterns 310 has a thickness in a range from 1000 nm to 20000 nm.

Figure 7:
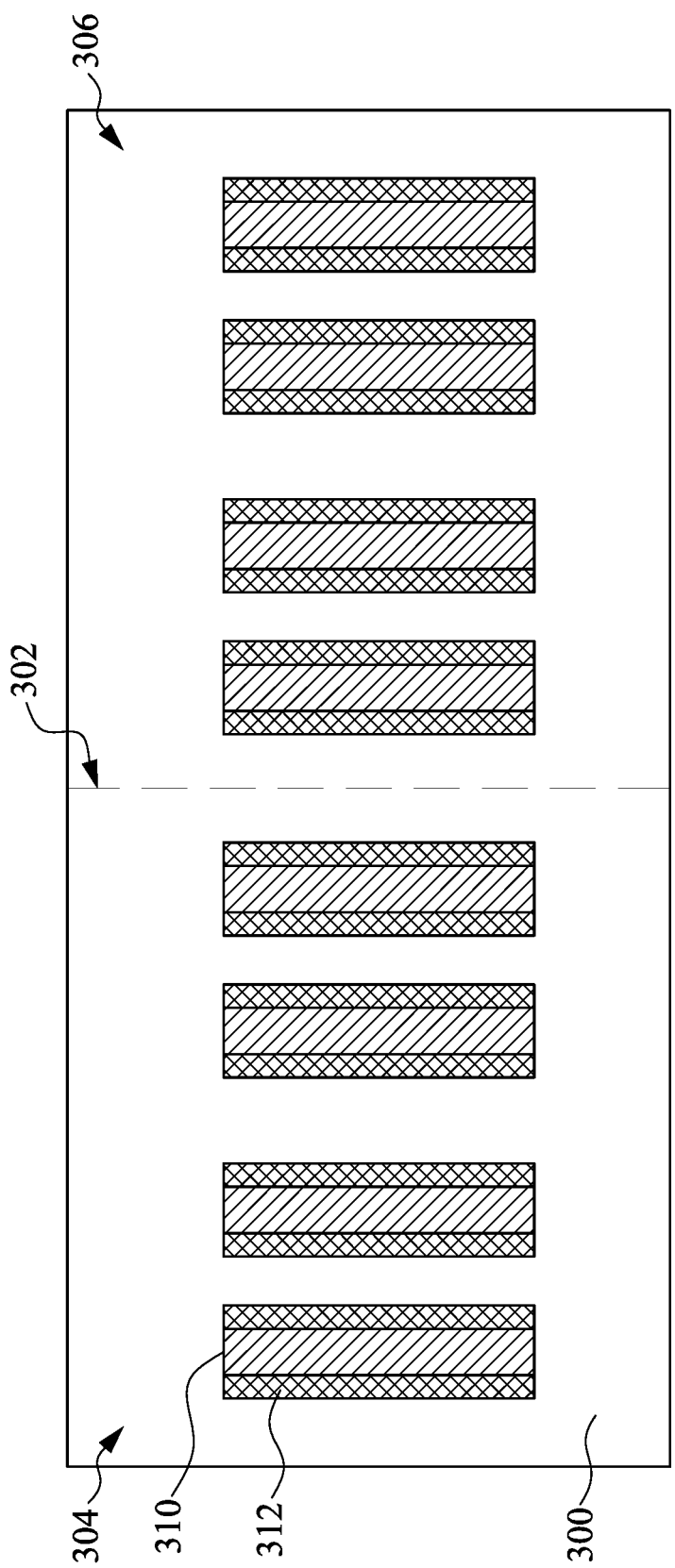

Reference is made to FIG. 7. A plurality of spacer lines 312 are formed on the substrate 300, in which a pair of the spacer lines 312 are in contact with opposing sidewalls of the corresponding dummy pattern 310. In some embodiments, a dielectric layer may be formed on the substrate 300 and the dummy patterns 310 by a deposition process, and then an etch back process is performed to form the spacer lines 312. In some embodiments, the dielectric layer for forming the spacer lines 312 has a thickness in a range from 200 nm to 7000 nm.

Figure 8:
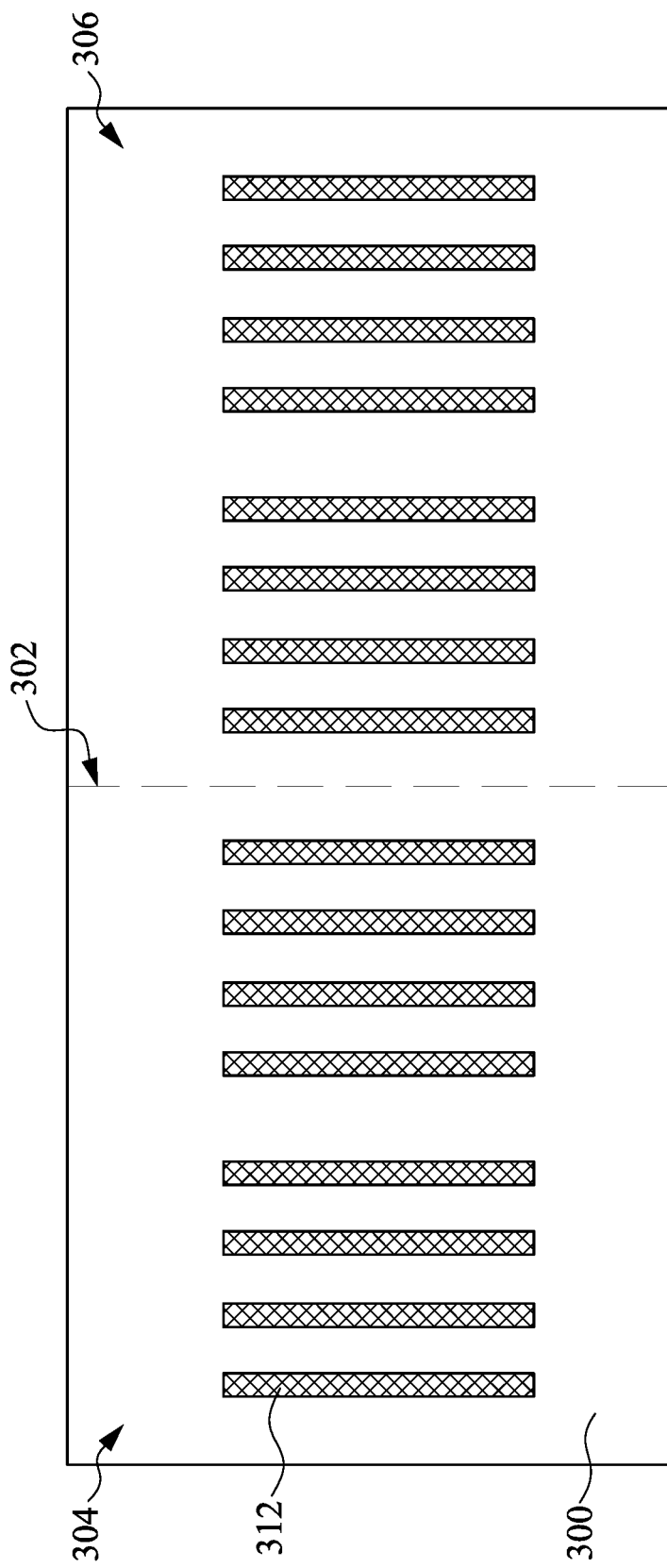

Reference is made to FIG. 8. The dummy patterns 310 are removed and the spacer lines 312 remain. In some embodiments, an etching process may be performed to remove the dummy patterns 310, in which the etching process includes wet etching, dry etching, or combination thereof.

Figure 9:
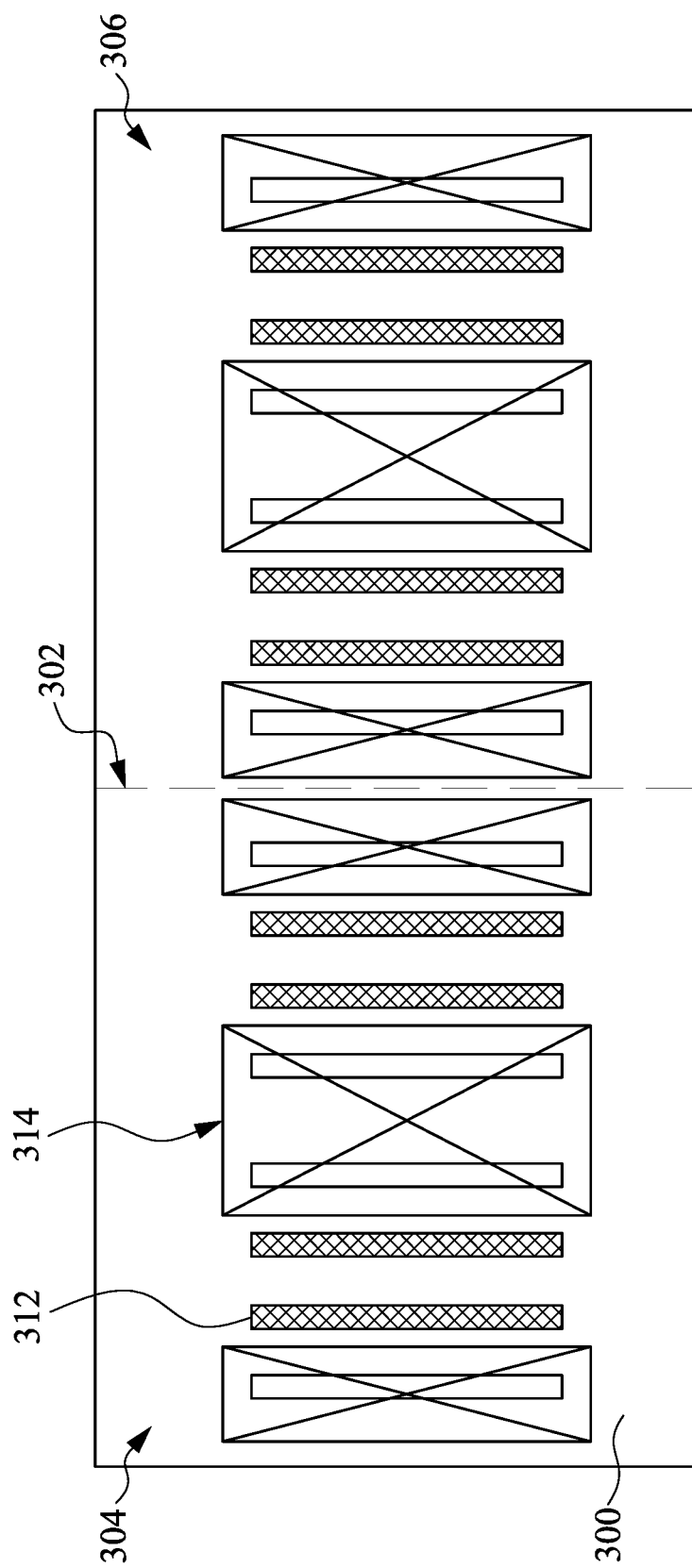

Reference is made to FIG. 9. Some of the spacer lines 312 are removed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching). In this regard, a first group of the spacer lines 312 covered by the rectangle patterns 314 are removed, and a second group of the spacer lines 312 remain. The remained spacer lines 312 within the first region 304 may be employed for forming fins in the I/O circuit, and the remained spacer lines 312 within the second region 306 may be employed for forming fins in the core circuit.

Figure 10:
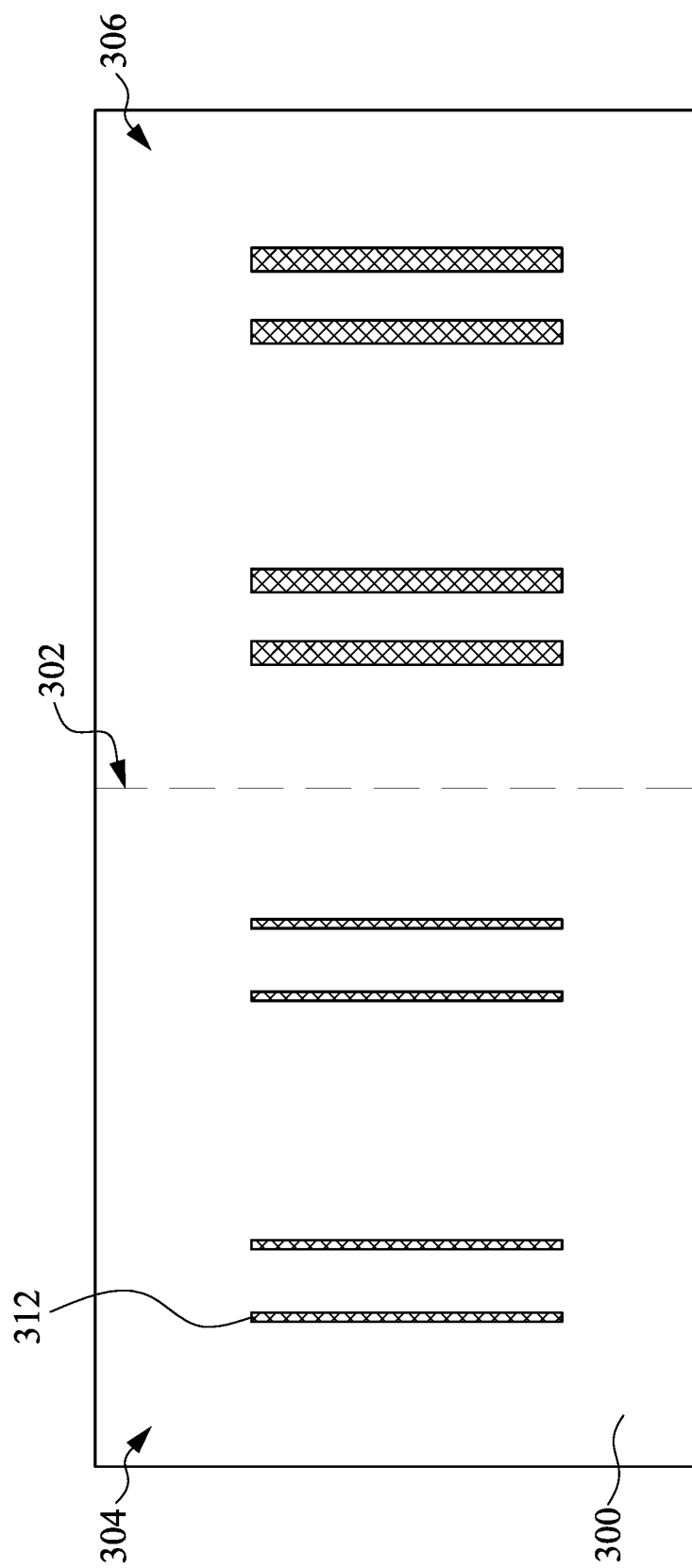

Reference is made to FIG. 10. A photolithography processes may be performed to trim down the width of the spacer lines 312 within the first region 304. In some embodiments, the width of the spacer lines 312 within the first region 304 is trimmed down, and the width of the spacer lines 312 within the second region 306 remain. Accordingly, after the photolithography processes, the spacer lines 312 within the first region 304 are thinner than the spacer lines 312 within the second region 306.

Figure 11:
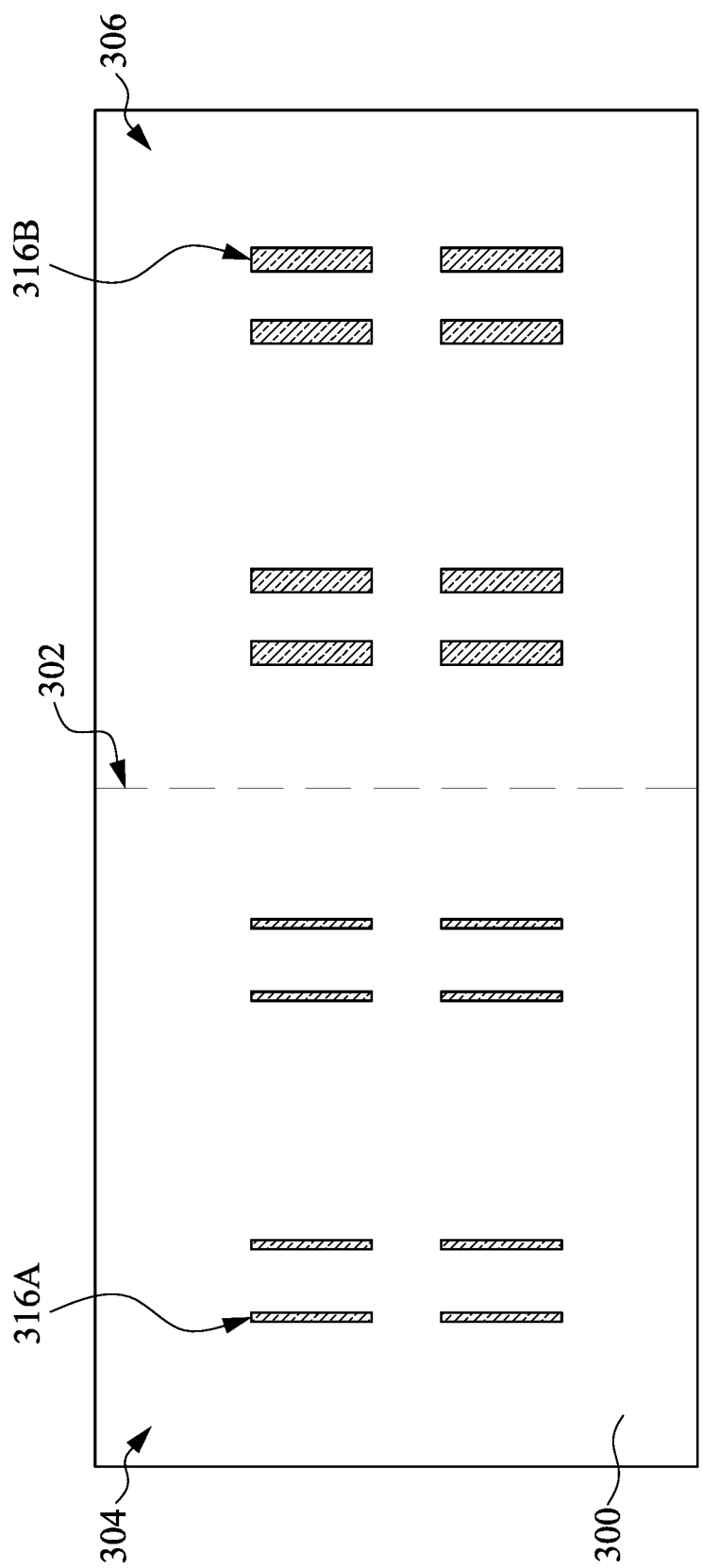

Reference is made to FIG. 11. Photolithography and etching processes are performed by using the spacer lines 312 of FIG. 10 as a hard mask layer, so as to remove some portions of the substrate 300. Then, the spacer lines 312 of FIG. 10 are removed. Within the first region 304, the remained portions of the substrate 300 underlying the spacer lines 312 can serve as fin lines 316A. Within the second region 306, the remained portions of the substrate 300 underlying the spacer lines 312 can serve as fin lines 316B. As depicted FIG. 10, since the spacer lines 312 within the first region 304 are thinner than the spacer lines 312 within the second region 306, the fin lines 316A inheriting the profile of the spacer lines 312 within the first region 304 are thinner than the fin lines 316B inheriting the profile of the spacer lines 312 within the second region 306. After the formation of the fin lines 316A and 316B, photolithography and etching processes can be performed to removing some portions of the fin lines 316A and 316B, so as to cut the fin lines 316A and 316B. For example, the continuous fin lines 316A and 316B may become discontinuous, so as to define OD areas. After defining the OD areas, processes can be subsequently performed to form elements on the substrate 300, such as a process for doping channel, a process for forming gate electrodes, a process for forming S/D features, a process for forming gate contacts, a process for forming gate contacts, formation of via openings or metal layers.

In some embodiments, the process for trimming down the width of the spacer lines 312 can be omitted. For example, after performing the processes as described in FIG. 9, photolithography and etching processes can be performed by using the spacer lines 312 of FIG. 10 as a hard mask layer, so as to remove some portions of the substrate 300. Then, the spacer lines 312 of FIG. 10 are removed, and remained portions of the substrate 300 underlying the spacer lines 312 can serve as fin lines. After the fin lines are formed, a photolithography patterning process is performed to removing some of the fin lines, and photolithography and etching processes then can be performed, so as to trim down the width of the remained fin lines.

Figure 12:
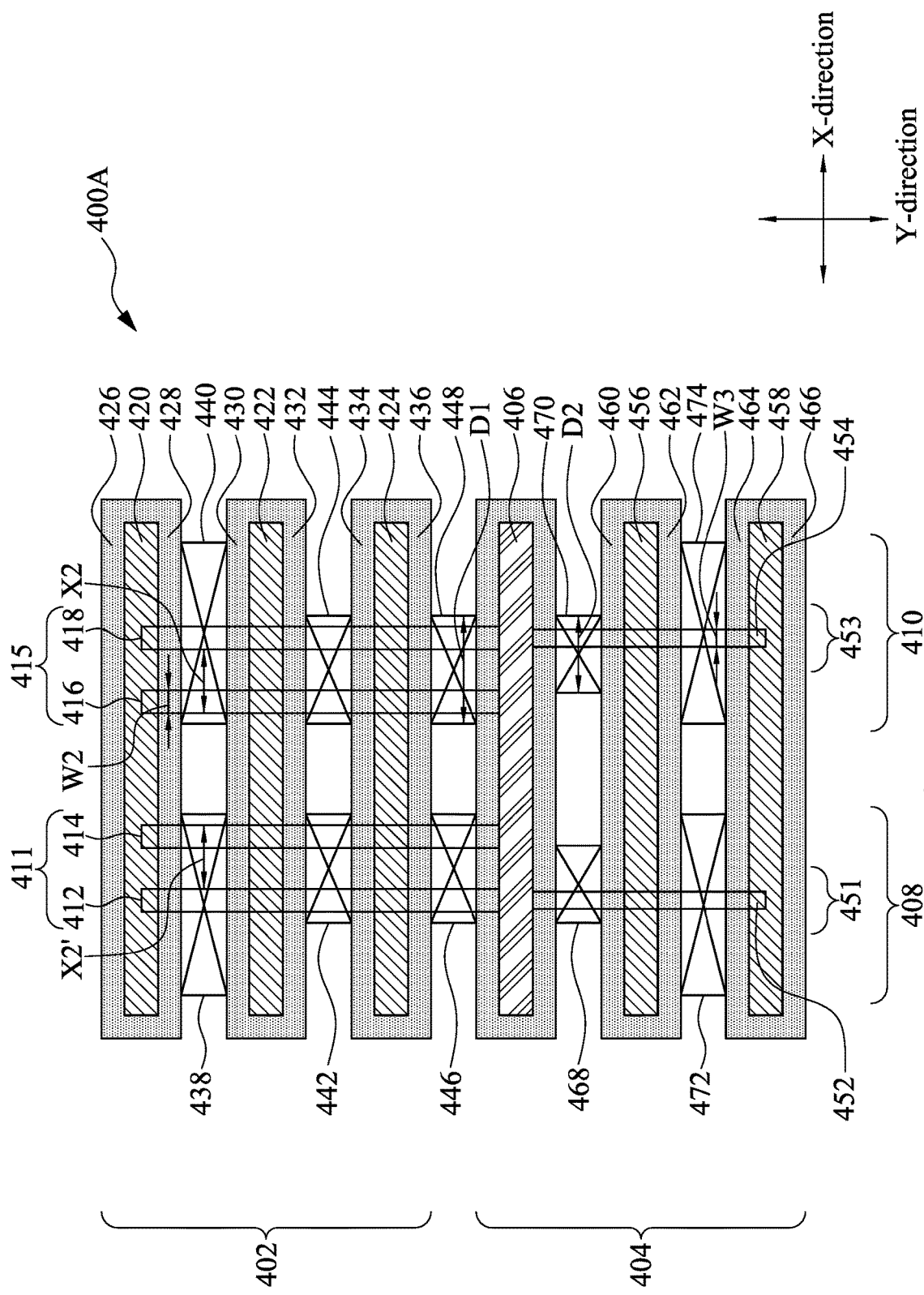
FIG. 12 illustrates a top view of a layout corresponding to a semiconductor device according to some embodiments of the present disclosure.

As illustrated in FIG. 12, which illustrates a top view of a layout 400A corresponding to a semiconductor device 400 according to some embodiments of the present disclosure. The semiconductor device 400 includes a first core circuit 402 and a second core circuit 404 which abut each other, in which each of the first core circuit 402 and the second core circuit 404 may be used in a core device of the semiconductor device 400. The semiconductor device 400 further includes a dummy gate 406 corresponding to a common edge of the first core circuit 402 and the second core circuit 404 which abut each other. Furthermore, the semiconductor device 400 may further include an I/O circuit. Many aspects of the I/O circuit are the same as or similar to those of the first circuit 102 as described in FIG. 3, and thus the detailed explanation may be omitted.

Many aspects of the first core circuit 402 are the same as or similar to those of the second circuit 104. For example, the first core circuit 402 includes a first active area region 411 with fins 412, 414, a second active area region 415 with fins 416, 418, a plurality of gate electrodes 420, 422, 424, a plurality of spacers 426, 428, 430, 432, 434, 436, and a plurality of contact areas 438, 440, 442, 444, 446, 448. The first active area region 411 is within a well region 408 which is an n-well region in one or more embodiments, and the second active area region 415 is within a well region 410 which is a p-well region in one or more embodiments.

In some embodiments, a width of at least one of the fins 412, 414, 416, 418, a spacing between a pair of the fins in of the first active area region 411 or the second active area region 415, and a pitch which is equal to a sum of the width and the spacing of the first core circuit 402 are the same as or similar to those of the second circuit 104. These dimension parameters of the first core circuit 402 can be defined by the same definition as described in FIG. 3. For the sake of simplicity, the these dimension parameters are designated by the same reference numerals of the corresponding dimension parameters as FIG. 3.

In some embodiment, at least one of the fins 412, 414 of the first active area region 411 and the fins 416, 418 of the second active area region 415 has the second width W2 measured along the X-direction as described in FIG. 3. For example, the fin 416 of the second active area region 415 has the second width W2 measured along the X-direction. In some embodiments, a pair of the adjacent fins of the first active area region 411 or the second active area region 415 are spaced from each other by the second spacing in the X direction. In some embodiments, the fins of the first active area region 411 or the second active area region 415 can be arranged along the X-direction by the second pitch, which can be defined by a sum of the second width and the second spacing. For example, the fins 412, 414 of the second active area region 415 are arranged along the X-direction by the second pitch.

In some embodiments, the second pitch is equal to a distance X2 from one side (e.g., the left side in FIG. 12) of the boundary of the fin 416 to the same side (e.g., the left side in FIG. 12) of the boundary of the fin 418. In some embodiments, the second pitch is equal to a distance X2' from one side (e.g., the right side in FIG. 12) of the boundary of the fin 412 to the same side (e.g., the right side in FIG. 12) of the boundary of the fin 414. Accordingly, in some embodiments, either the distance X2 or the distance X2' can be referred to as the second pitch, and the fins of the first and second active area regions 411 and 415 are arranged along the X-direction by the second pitch.

Many aspects of the second core circuit 404 are the same as or similar to those of the first core circuit 402. For example, the second core circuit 404 includes a third active area region 451 with a fin 452, a fourth active area region 453 with a fins 454, a plurality of gate electrodes 456, 458, a plurality of spacers 460, 462, 464, 466, and a plurality of contact areas 468, 470, 472, 474. The third active area region 451 is within the n-well region 408, and the fourth active area region 453 is within the p-well 410. Different from the first core circuit 402, the second core circuit 404 is referred as a single fin device, and the first core circuit 402 is referred as a multiple fin device. For example, the first active area region 411 with the fins 412, 414 and the third active area region 451 with the fin 452 are located within the same n-well region 408, and the fin number of the first active area region 411 is greater than that of the third active area region 451. With the difference between the fin numbers of the first core circuit 402 and the second core circuit 404, the first core circuit 402 can be used for a high speed application, and the second core circuit 404 with short contact layer can result in capacitance reduction and power reduction.

In some embodiments, a width of at least one of the fins 452 and 454 can be defined by the similar definition as described in FIG. 3. In some embodiment, at least one of the fin 452 of the third active area region 451 and the fin 454 of the fourth active area region 453 has a third width measured along the X-direction. For example, the fin 454 of the fourth active area region 453 has the second width W3 measured along the X-direction.

The dummy gate 406 extends along the X-direction of the layout 400A and is across the well regions 408, 410. The dummy gate may be a dielectric dummy gate comprising one or more dielectric materials. Example dielectric materials of the dummy gate 406 include, but are not limited to, oxide-based dielectric materials, such as $SiO_2$, SiON, $Si_3N_4$, SiOCN and combinations thereof. In at least one embodiment, the gate electrodes 420, 422, 424 include one or more metal materials, and the dummy gate 406 is free of the metal materials of the gate electrodes 420, 422, 424. In some embodiments, the spacers are arranged along longitudinal sides of the dummy gate 406 in the X direction. The dummy gate 406 is configured to provide isolation between the first core circuit 402 and the second core circuit 404. In some embodiments, a fin-cutting process may be performed to form a trench between the first core circuit 402 and the second core circuit 404, and such trench is filled with at least one dielectric material, so as to from the dummy gate 406. In some embodiments, the dummy gate 406 may include single or multi dielectric layers.

In some embodiments, at least one of the contact areas 438, 440, 442, 444, 446, 448 of the first core circuit 402 is rectangular having a first side parallel to the X-direction, and the first side having a first length. For example, the first side of the contact area 448 has the first length labelled as a first dimension D1. In some embodiments, at least one of the contact areas 468, 470, 472, 474 of the second core circuit 404 is rectangular having a second side parallel to the X-direction, and the second side having a first length different than the first length. For example, the second side of the contact area 470 has the second length labelled as a second dimension D2, and the first dimension D1 is greater than the second dimension D2. Accordingly, the second side of the contact area 470 is shorter than the first side of the contact area 448. In some embodiments, a ratio of the first dimension D1 to the second dimension D2 is in a range from 1.1 to 3.

FIG. 13 is a cross-section view of the I/O circuit 401 of the semiconductor device 400. FIG. 14 is a cross-section view of the first core circuit 402 of the semiconductor device 400. FIG. 15 is a cross-section view of the third core circuit 404 of the semiconductor device 400. The FIGS. 13, 14, and 15 are respectively taken lines along gate electrodes thereof as depicted FIGS. 4 and 5.

The semiconductor device 400 further comprises one or more isolation structures over and around the well regions 4082 and 410. In the example configuration in FIGS. 13, 14, and 15, the isolation structures 474A, 474B, 474C are over the corresponding well regions 408 and 410. The isolation structures 474A, 474B, 474C electrically isolate various elements of the semiconductor device 400 from each other. For example, as illustrated in FIG. 13, the isolation structure 474A electrically isolates fins 476 and 477 from each other. Similarly, as illustrated in FIG. 14, the isolation structure 474B electrically isolates fins 416 and 418 from each other. In at least one embodiment, at least one of the isolation structures 474A, 474B, 474C comprises one or more STI regions. Example materials of the STI regions include, but are not limited to, silicon oxide, silicon nitride, silicon oxynitride, fluoride-doped silicate, and/or any other low k dielectric materials. In some embodiments, the STI thickness is from 50 nm to 200 nm.

In the example configuration in FIG. 13, a gate electrode 480 wraps over the fins 476, 477. To electrically isolate the gate electrode 480 from the fins 476, 477, a first gate dielectric layer 478 is arranged under and around the gate electrode 480, in which the fins 476, 477 are covered by the first gate dielectric layer 478. Each of the fins 476, 477 has a first width as depicted in FIG. 4. For example, the top surface of the fin 476 has the first width W1 measured along the X-direction. A pair of the fins 476, 477 are spaced from each other by a first spacing, as depicted in FIG. 4. The fins 476, 477 can be arranged by the first pitch, as depicted in FIG. 4. The first pitch can be defined by the sum of the first width and the first spacing. For example, the fins 476, 477 are arranged by the distance X1 measured along the X-direction. Furthermore, the first gate dielectric layer 478 covering the fins 476, 477 has a first thickness T1. The first thickness T1 of the first gate dielectric layer 478 can be referred to as a height thereof measured from the top surface of one of the fins 476, 477, as depicted in FIG. 4.

In the example configuration in FIG. 14, the gate electrode 424 wraps over the fins 416, 418. To electrically isolate the gate electrode 424 from the fins 416, 418, a second gate dielectric layer 482 is arranged under and around the gate electrode 424, in which the fins 416, 418 are covered by the second gate dielectric layer 482. Each of the fins 416, 418 has a second width as depicted in FIG. 12. For example, the top surface of the fin 418 has the second width W2 measured along the X-direction. A pair of the fins 416, 418 are spaced from each other by a second spacing, as depicted in FIG. 12. The fins 416, 418 can be arranged by the second pitch, as depicted in FIG. 12. The second pitch can be defined by the sum of the second width and the second spacing. For example, the fins 416, 418 are arranged by the distance X2 measured along the X-direction. Furthermore, the second gate dielectric layer 482 covering the fins 416, 418 has a second thickness T2. The first thickness T2 of the second gate dielectric layer 482 can be referred to as a height thereof measured from the top surface of one of the fins 416, 418, as depicted in FIG. 5.

In the example configuration in FIG. 15, the gate electrode 456 wraps over the fin 454. To electrically isolate the gate electrode 456 from the fin 454, a third gate dielectric layer 484 is arranged under and around the gate electrode 456, in which the fin 454 are covered by the third gate dielectric layer 484. The top surface of the fins 456 has the third width W3 measured along the X-direction, as depicted in FIG. 12. Furthermore, the third gate dielectric layer 484 covering the fin 454 has a third thickness T3. The third thickness T3 of the third gate dielectric layer 484 can be referred to as a height thereof measured from the top surface of the fin 454.

Reference is made to FIGS. 13, 14, and 15. The first thickness T1 of the first gate dielectric layer 478 is greater than either the second thickness T2 of the second gate dielectric layer 482 or the third thickness T3 of the third gate dielectric layer 484. For example, a ratio of the first thickness T1 of the first gate dielectric layer 478 to the second thickness T2 of the second gate dielectric layer 482 is greater than 1.3. In some embodiments, a ratio of the first thickness T1 of the first gate dielectric layer 478 to the second thickness T2 of the second gate dielectric layer 482 is in a range from 1.3 to 2. In some embodiments, the second and third gate dielectric layers 482 and 484 have the same thickness. Such thickness difference may be advantageous to provide various isolations suitable for different device that have different functions. For example, the I/O circuit 401 used in the I/O device, the first core circuit 402 used in the core device, and the third core circuit 404 used in the other core device may provide different functions and have different device characteristics, such as device dimensions, driving currents, threshold voltages, device densities, and so forth. The thickness difference between the first gate dielectric layer 478 and either the second gate dielectric layer 482 or the third gate dielectric layer 484 is thus advantageous to provide suitable isolations for the I/O device and the core device. Stated differently, with the thickness difference between the first gate dielectric layer 478 and either the second gate dielectric layer 482 or the third gate dielectric layer 484, the I/O device can be operated at a voltage higher than that of the core device.

In some embodiments, the first width W1 of at least one of the fin 476, 477 is less than the second width W2 of at least one of the fins 416, 418. In some embodiments, the first width W1 of at least one of the fin 476, 477 is less than the third width W3 of the fin 454. In some embodiments, the third width W3 of the fin 454 is less than the second width W2 of at least one of the fins 416, 418. In some embodiments, a ratio of the second width W2 of at least one of the fins 416, 418 to the first width W1 of at least one of the fin 476, 477 is equal to or greater than 1.05. In some embodiments, a ratio of the second width W2 of at least one of the fins 416, 418 to the first width W1 of at least one of the fin 476, 477 is equal to or greater than 1.1. In some embodiments, a ratio of the second width W2 of at least one of the fins 416, 418 to the first width W1 of at least one of the fin 476, 477 is in a range from 1.05 to 1.3. In some embodiments, a ratio of the second width W2 of at least one of the fins 416, 418 to the third width W3 of the fin 454 is equal to or greater than 1.05. In some embodiments, a ratio of the second width W2 of at least one of the fins 416, 418 to the third width W3 of the fin 454 is equal to or greater than 1.1. In some embodiments, the first spacing is greater than the second spacing. Accordingly, due to that the first width is less than the second width and the first spacing is greater than the second spacing, the first pitch X1 can be equal to the second pitch X2 (i.e., the first pitch and the second pitch are substantially the same). For example, the first pitch X1 and the second pitch X2 may be less than about 32 nm. With such dimension configurations, although the first thickness T1 of the first gate dielectric layer 478 is greater than the second thickness T2 of the second gate dielectric layer 482, the space between a pair of the fins 476 and 477 is sufficient to be filled with the gate electrode 480, which may include a work function layer and a contact layer. As such, either shrinking the pattern layout dimension or being sufficient to fill the space the adjacent fins of the I/O device with the gate electrode 480 is achieved.

Figure 16:
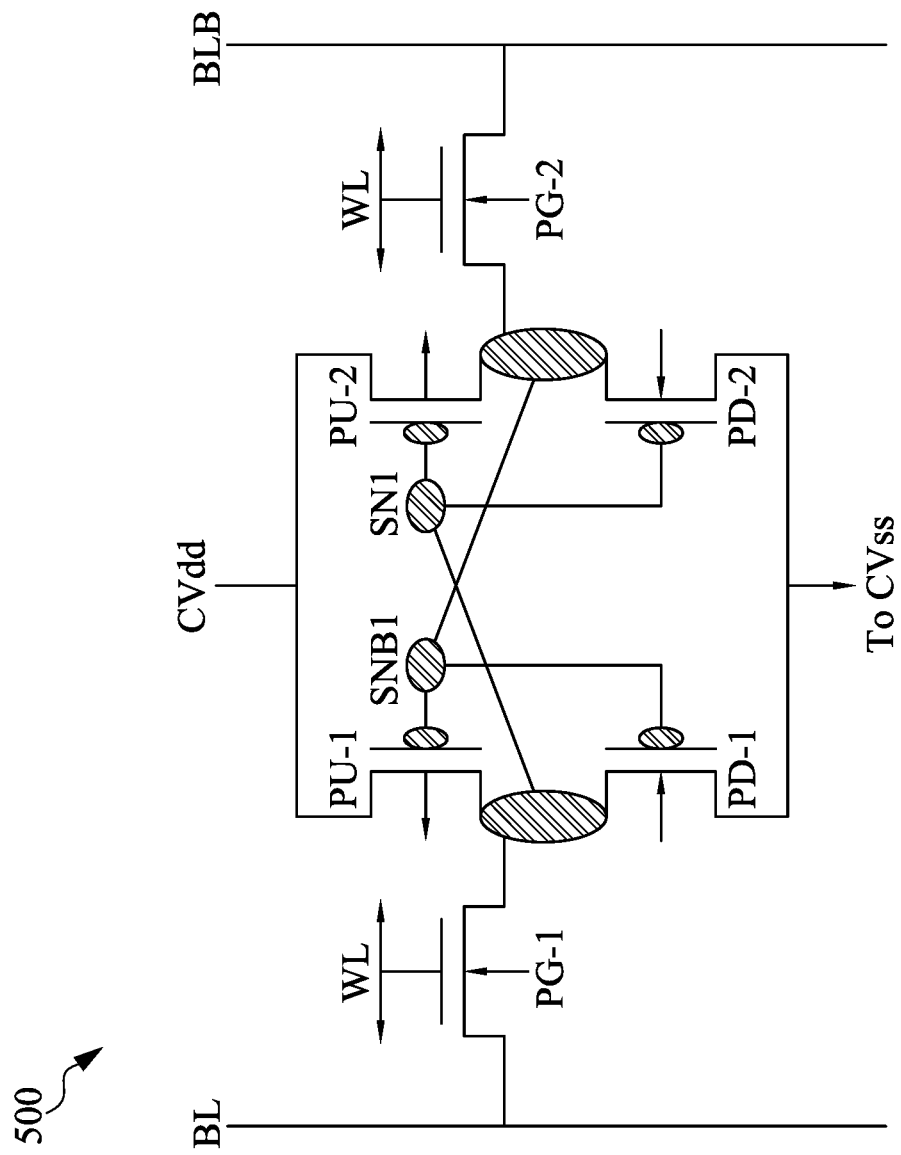
FIG. 16 illustrates a circuit schematic for a single-port SRAM cell.
Figure 17:
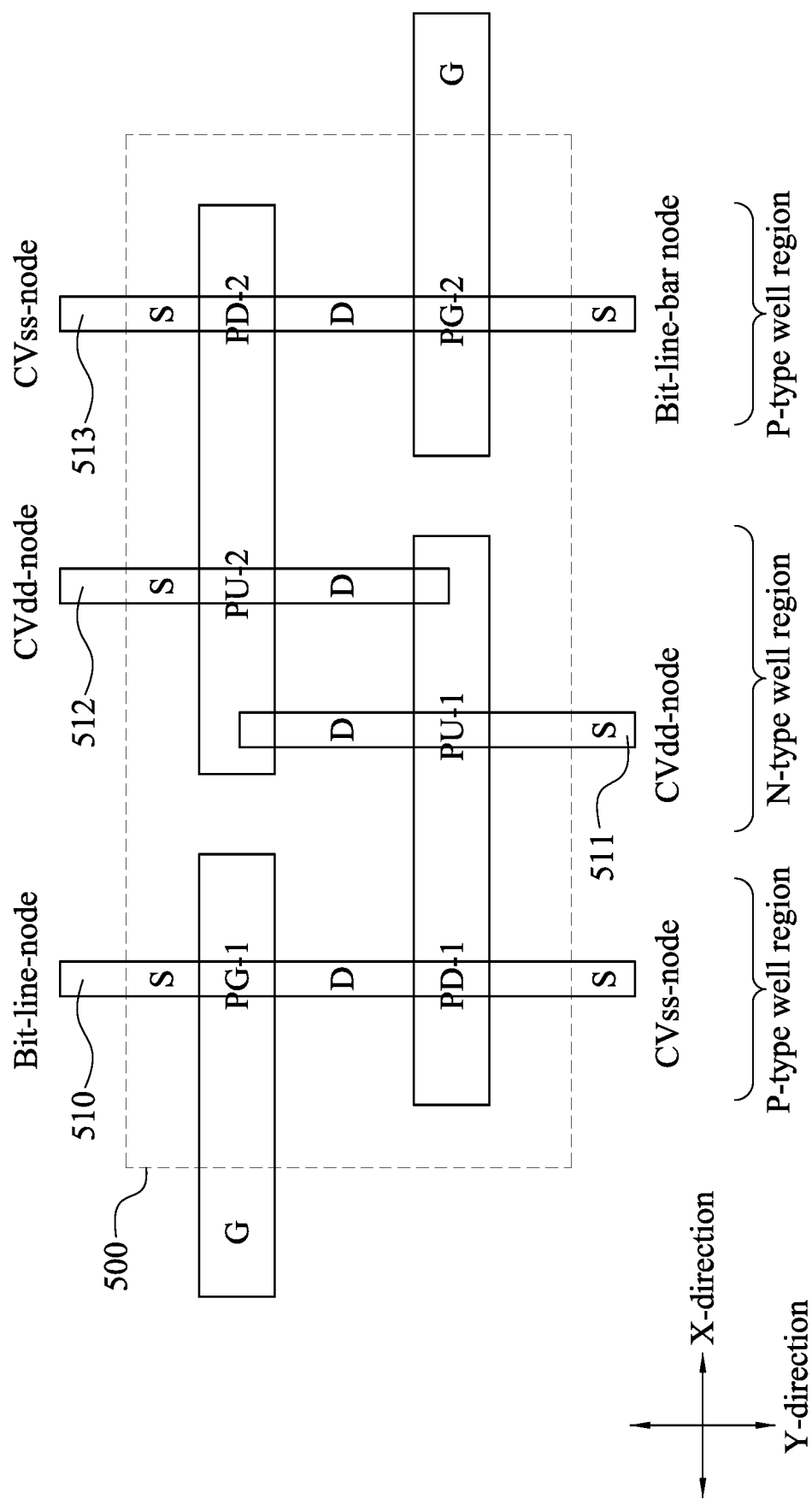
FIG. 17 illustrates the corresponding layout in a top view of the single-port SRAM cell according to some embodiments of the present disclosure.

In some embodiments, the second core circuit 404 may serve as a single-port SRAM cell, and the layout of the second core circuit 404 can be designed as a single-port SRAM cell layout with the relationship among the above dimension configurations. For example, FIG. 16 illustrates a circuit schematic for a single-port SRAM cell 500. FIG. 17 illustrates the corresponding layout in a top view of the single-port SRAM cell 500 according to some embodiments of the present disclosure, in which gates G, drains D, sources S corresponding to transistors are labelled in FIG. 17.

The single-port SRAM cell 500 includes pull-up transistors PU-1, PU-2; pull-down transistors PD-1, PD-2; and pass-gate transistors PG-1, PG-2. As show in the circuit diagram, transistors PU-1 and PU-2 are p-type transistors, such as the p-type FinFETs discussed above, and transistors PG-1, PG-2, PD-1, and PD-2 are n-type FinFETs discussed above.

The drains of pull-up transistor PU-1 and pull-down transistor PD-1 are coupled together, and the drains of pull-up transistor PU-2 and pull-down transistor PD-2 are coupled together. Transistors PU-1 and PD-1 are cross-coupled with transistors PU-2 and PD-2 to form a first data latch. The gates of transistors PU-2 and PD-2 are coupled together and to the drains of transistors PU-1 and PD-1 to form a first storage node SN1, and the gates of transistors PU-1 and PD-1 are coupled together and to the drains of transistors PU-2 and PD-2 to form a complementary first storage node SNB1. Sources of the pull-up transistors PU-1 and PU-2 are coupled to power voltage CVdd, and the sources of the pull-down transistors PD-1 and PD-2 are coupled to a ground voltage CVss.

The first storage node SN1 of the first data latch is coupled to bit line BL through pass-gate transistor PG-1, and the complementary first storage node SNB1 is coupled to complementary bit line BLB through pass-gate transistor PG-2. The first storage node SN1 and the complementary first storage node SNB1 are complementary nodes that are often at opposite logic levels (logic high or logic low). Gates of pass-gate transistors PG-1 and PG-2 are coupled to a word line WL.

As shown in the top view layout of FIG. 17, the single-port SRAM cell 500 includes a plurality of fin lines 510-513 (also referred to as active region, or OD). The N-type fin lines 510 and 513 are comprised of a non-germanium-containing semiconductor material, for example silicon. The P-type fine lines 511-512 are comprised of silicon germanium for strain effect enhancement.

Similar to the SRAM cells discussed above, the fin lines 510 and 513 can be located over a P-type well region of the SRAM cell 500 extend continuously in the Y-direction, whereas the fin lines 511 and 512 located over an N-type well region of the SRAM cell 500 extend discontinuously in the Y-direction. In other words, the fin line 511 and the fin line 512 each extend partially into, but not completely through, the SRAM cell 500. According to the embodiment shown in FIG. 17, the fin line 511 extends into the SRAM cell 500 from the "bottom" of the SRAM cell 500, and it terminates into the SRAM cell 500 on the drain side of the pull-up transistor PU-1. The fin line 512 extends into the SRAM cell 500 from the "top" of the SRAM cell 500, and it terminates into the SRAM cell 500 on the drain side of the pull-up transistor PU-2. This type of configuration helps prevent the data node leakage between the drain nodes of adjacent pull-up transistors.

As described above, the semiconductor device has the first circuit configured to use in the I/O device and the second circuit configured to use in the core device. In the first circuit, at least one of the fins has the first width, and the first gate dielectric layer covering the fins has the first thickness. In the second circuit, at least one of the fins has the second width, and the second gate dielectric layer covering the fins has the second thickness. The first width is less than the second width, and the first thickness is greater than the second thickness. The thickness difference between the first and second gate dielectric layers is thus advantageous to provide suitable isolations for the I/O device and the core device. Stated differently, with the thickness difference between the first and second gate dielectric layers, the I/O device can be operated at a voltage higher than that of the core device. Furthermore, with the first width is less than the second width, although the first thickness is greater than the second thickness, the space between a pair of the adjacent fins used in the first circuit is sufficient to be filled with the gate electrode, which may include the first work function layer and the first contact layer. As such, either shrinking the pattern layout dimension or being sufficient to fill the space the adjacent fins of the I/O device with the gate electrode is achieved.

In some embodiments, a semiconductor device includes a dielectric dummy gate, a plurality of first semiconductor fins, and a plurality of second semiconductor fins. The dielectric dummy gate extends along a first direction. The first semiconductor fins extend along a second direction within a first core circuit region on a first side of the dielectric dummy gate, and the second direction is substantially perpendicular to the first direction. The second semiconductor fins extend along the second direction within a second core circuit region on a second side of the dielectric dummy gate opposite the first side of the dielectric dummy gate. A number of the second semiconductor fins within the second core circuit region is less than a number of the first semiconductor fins within the first core circuit region, and each of the second semiconductor fins has a width less than a width of each of the first semiconductor fins.

In some embodiments, a semiconductor device includes a first core circuit and a second core circuit electrically isolated from the first core circuit by a dielectric dummy gate. The first core circuit includes a plurality first semiconductor fins and a first source/drain contact extending a first length across the first semiconductor fins. The second core circuit includes a second semiconductor fin and a second source/drain contact extending a second length across the second semiconductor fin. The second length of the second source/drain contact is less than the first length of the first source/drain contact, and each of the first semiconductor fins has a width greater than a width of the second semiconductor fin.

In some embodiments, a semiconductor device includes an I/O circuit, a first core circuit, and a second core circuit. The I/O circuit includes a first semiconductor fin. The first core circuit includes a second semiconductor fin. The second core circuit includes a third semiconductor fin. A width of the third semiconductor fin is greater than a width of the first semiconductor fin of the I/O circuit and less than a width of the second semiconductor fin of the first core circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a dielectric dummy gate extending along a first direction;
a plurality of first semiconductor fins extending along a second direction within a first core circuit region on a first side of the dielectric dummy gate, the second direction being substantially perpendicular to the first direction; and
a plurality of second semiconductor fins extending along the second direction within a second core circuit region on a second side of the dielectric dummy gate opposite the first side of the dielectric dummy gate, wherein a number of the second semiconductor fins within the second core circuit region is less than a number of the first semiconductor fins within the first core circuit region, and each of the second semiconductor fins has a width less than a width of each of the first semiconductor fins.

2. The semiconductor device of claim 1, wherein the first semiconductor fins are arranged along the first direction by a first pitch, and the second semiconductor fins are arranged along the first direction by a second pitch greater than the first pitch.

3. The semiconductor device of claim 1, further comprising:
a spacer on the first side of the dielectric dummy gate, and overlapping longitudinal ends of the first semiconductor fins.

4. The semiconductor device of claim 1, further comprising:
a spacer on the second side of the dielectric dummy gate, and overlapping longitudinal ends of the second semiconductor fins.

5. The semiconductor device of claim 1, further comprising:
a spacer enclosing the dielectric dummy gate when viewed from above.

6. The semiconductor device of claim 1, further comprising:
a first gate dielectric layer extending across the first semiconductor fins; and
a second gate dielectric layer extending across the second semiconductor fins and having a thickness comparable to a thickness of the first gate dielectric layer.

7. The semiconductor device of claim 6, further comprising:
a third gate dielectric layer of an I/O device having a thickness greater than the thickness of the first gate dielectric layer and the thickness of the second gate dielectric layer.

8. The semiconductor device of claim 1, further comprising:
a first contact and a second contact extending within the first core circuit region and across both the first semiconductor fins; and
a third contact and a fourth contact extending within the second core circuit region and across one of the second semiconductor fins.

9. The semiconductor device of claim 8, wherein a length difference between the third and fourth contacts is greater than a length difference between the first and second contacts, the length differences are measured in the first direction.

10. The semiconductor device of claim 8, further comprising:
a metal gate extending within the first core circuit region and between the first and second contacts, wherein the metal gate has a length comparable to a length of the dielectric dummy gate, and the lengths are measured in the first direction.

11. The semiconductor device of claim 8, further comprising:
a metal gate extending within the second core circuit region and between the third and fourth contacts, wherein the metal gate has a length comparable to a length of the dielectric dummy gate, and the lengths are measured in the first direction.

12. A semiconductor device, comprising:
a first core circuit comprising a plurality first semiconductor fins and a first source/drain contact extending a first length across the first semiconductor fins; and
a second core circuit electrically isolated from the first core circuit by a dielectric dummy gate, the second core circuit comprising a second semiconductor fin and a second source/drain contact extending a second length across the second semiconductor fin, wherein the second length of the second source/drain contact is less than the first length of the first source/drain contact, and each of the first semiconductor fins has a width greater than a width of the second semiconductor fin.

13. The semiconductor device of claim 12, wherein a ratio of the first length of the first source/drain contact to the second length of the second source/drain contact is in a range from about 1.1 to about 3.

14. The semiconductor device of claim 12, wherein a ratio of the width of each of the first semiconductor fins to the width of the second semiconductor fin is equal to or greater than about 1.05.

15. The semiconductor device of claim 12, further comprising:
a first gate dielectric layer extending across the first semiconductor fins; and
a second gate dielectric layer extending across the second semiconductor fin and having a thickness comparable to a thickness of the first gate dielectric layer.

16. A semiconductor device, comprising:
an I/O circuit comprising a first semiconductor fin;
a first core circuit comprising a second semiconductor fin; and
a second core circuit comprising a third semiconductor fin, wherein a width of the third semiconductor fin is greater than a width of the first semiconductor fin of the I/O circuit and less than a width of the second semiconductor fin of the first core circuit.

17. The semiconductor device of claim 16, wherein a thickness of a gate dielectric layer in the I/O circuit is greater than a thickness of a gate dielectric layer in the first core circuit.

18. The semiconductor device of claim 16, wherein a thickness of a gate dielectric layer in the I/O circuit is greater than a thickness of a gate dielectric layer in the second core circuit.

19. The semiconductor device of claim 16, wherein the I/O circuit comprises a plurality of the first semiconductor fins arranged at a first pitch, the first core circuit comprises a plurality of the second semiconductor fins arranged at a second pitch comparable to the first pitch.

20. The semiconductor device of claim 19, wherein the second core circuit comprises a plurality of the third semiconductor fins arranged at a third pitch greater than the second pitch.

* * * * *